US006741338B2

(12) United States Patent
McArthur et al.

(10) Patent No.: US 6,741,338 B2
(45) Date of Patent: May 25, 2004

(54) IN-SITU SOURCE METROLOGY INSTRUMENT AND METHOD OF USE

(75) Inventors: Bruce B. McArthur, San Diego, CA (US); Adlai H. Smith, San Diego, CA (US)

(73) Assignee: Litel Instruments, San Diego, CA (US)

( * ) Notice: Subject to any disclaimer, the term of this patent is extended or adjusted under 35 U.S.C. 154(b) by 19 days.

(21) Appl. No.: 09/974,520

(22) Filed: Oct. 9, 2001

(65) Prior Publication Data

US 2003/0007143 A1 Jan. 9, 2003

Related U.S. Application Data

(63) Continuation-in-part of application No. 09/247,446, filed on Feb. 10, 1999, now Pat. No. 6,356,345.

(51) Int. Cl.$^7$ ................................................ G01J 1/00
(52) U.S. Cl. .................................... 356/121; 356/401
(58) Field of Search ........................... 430/311, 325–6, 430/331; 355/53, 55, 57, 66–7; 356/121–2, 399–401, 345, 353–4; 250/348, 548

(56) References Cited

U.S. PATENT DOCUMENTS

| | | | |
|---|---|---|---|
| 3,819,265 A | 6/1974 | Feldman et al. ............... 355/51 |
| 4,861,148 A | 8/1989 | Sato et al. ..................... 359/366 |
| 4,943,733 A | * 7/1990 | Mori et al. .................... 250/548 |
| 5,136,413 A | 8/1992 | MacDonald et al. ......... 359/213 |
| 5,285,236 A | 2/1994 | Jain ............................... 355/53 |
| 5,386,319 A | 1/1995 | Whitney ........................ 359/575 |
| 5,392,119 A | 2/1995 | McArthur et al. ........... 356/515 |
| 5,640,233 A | 6/1997 | McArthur et al. ........... 356/124 |
| 5,666,206 A | * 9/1997 | Uchiyama ..................... 356/401 |
| 5,828,455 A | * 10/1998 | Smith et al. .................. 356/515 |
| 5,929,991 A | 7/1999 | McArthur et al. ........... 356/520 |
| 5,978,085 A | * 11/1999 | Smith et al. .................. 356/521 |
| 6,040,894 A | 3/2000 | Takahashi ..................... 355/53 |

FOREIGN PATENT DOCUMENTS

JP          02010627          9/1986

OTHER PUBLICATIONS

Arnold et al., "Wafer steppers for the 64M and 256MBit Memory Generations", *Proceedings of BACUS conference, SPIE Critical Review of Optical Science and Technology, CR51*:42 (1993)

Borodovsky, Y., "Impact of Local Partial Coherence Variations on Exposure Tool Performance", *Optical/Laser Microlithography VIII*, SPIE, *1440*:750 1995.

Brunner et al., "Quantitative stepper metrology using the focus monitor test mask", *Optical/Laser Microlithography VII*, SPIE, *2197*:541 (1994).

(List continued on next page.)

*Primary Examiner*—Russ Adams
*Assistant Examiner*—Magda Cruz

(57) ABSTRACT

A process of measuring the radiant intensity profile of an effective source of a projection image system that has an effective source, an object plane, an imaging objective, an exit pupil, and an image plane. The improved process consists of selecting at least one field point and a corresponding aperture plane aperture and projecting a plurality of images of the selected field point through the corresponding selected aperture plane aperture at a plurality of various intensities of the effective source. By analyzing the recorded images of the effective source at various intensities it is possible to determine a radiant intensity profile of the image source at the selected field point.

15 Claims, 26 Drawing Sheets

AS = APERTURE STOP
OP = OBJECT PLANE OR RETICLE PLANE
IP = IMAGE PLANE OR WAFER PLANE
FP = FOCAL PLANE OR IN FOCUS OUTPUT PLANE
L1 = LENS GROUP 1
L2 = LENS GROUP 2   CO = CONDENSER
LA = LIGHT SOURCE
OA = OPTICAL AXIS

OTHER PUBLICATIONS

Ceglio et al., "Soft x–ray projection lithography", *J. Vanc. Sci. Technology B*, *8(6)*:1325 (1990).

Dusa et al., "In–house characterization technique for steppers", *Optical/Laser Microlithography II*, SPIE, *1088*:354 (1989).

Freischlad et al., "A dual–wavelength interferometer for testing projection lenses", *Optical/Laser Microlithography VIII*, SPIE, *2440*:743 (1995).

Gemmink, J.W., "A simple and calibratable method for the determination of optimal focus", *Optical/Laser Microlithography II*, SPIE, *1088*:220 (1989).

Glatzel, E., "New lenses for microlitography", 1980 *International Lens Design Conference (OSA)*, SPIE, *237*:310 (1980).

Goodman et al., "Condenser Aberrations in Köhler Illumination", *Optical/Laser Microlithography*, SPIE, *922*:108 (1988).

Hasan et al., "Automated electrical measurements of registration errors in step and repeat optical lithography systems", *IEEE Transactions on Electron Devices*, *ED–27(12)*, (1980).

Huang, C., "In–situ optimization of an i–line optical projection lens", *Optical/Laser Microlithography VIII*, SPIE, *2440*:735 (1995).

Kirk, J.P., "Astigmatism and field curvature from pin–bars", *Optical/Laser Microlithography IV SPIE*, *1463*:282 (1991).

Kirk et al., "Pinholes and pupil fills", *Microlithography World*, *6(4)*:25 (1997).

Kouno et al., "An x–ray stepper for synchrotron radiation lithography", *J. Vac. Sci. Technology B*, *6(6)*:2135 (1988).

Peters, D.W., The effects of an incorrect condenser setup on reduction lens printing capabilities, *Interface 85*, Kodak Pub. *G–1546*:6–72 (1985).

Phillips et al., "High resolution lens system for submicron photolithography", *1980 International Lens Design Conference (OSA)*, SPIE, *237*:329 (1980).

Unger et al., "New i–line and deep–UV optical wafer steppers", *Optical/Laser Microlithography IV*, SPIE, *1463*:725 (1991).

van den Brink et al., "New 0.54 Aperture i–line wafer stepper with field by leveling combined with global alignment", *Optical/Laser Microlithography IV*, SPIE, *1463*:709 (1991).

Viswanathan et al., "Development of Reflective Optical Systems for XUV Projection Litigraphy", *OSA Proceedings on Soft–X–Ray Projection Lithography*, *12*:30 (1991).

Yoshitake et al., "Multispot Scanning Exposure System for Excimer Laser Stepper", *Optical/Laser Microlithography IV*, SPIE, *1463*:678 (1991).

V.K. Viswanathan et al., "Development of Reflective Optical Systems for XUV Projection Lithography," *OSA Proceedings on Soft–X–Ray Projction Lithography*, vol. 12, p. 30 (1991).

Yudong et al., "A new family of 1:1 catadioptric broadband deep UV high NA lithography lenses", *Optical/Laser Microlithography IV*, SPIE, *1463*:688 (1991).

Zych et al., "Electrical Methods for Precision Stepper Column Optimization", *Optical Lithography V.*, SPIE, *633*:98 (1986).

* cited by examiner

P1, P2 = POINTS IN RETICLE PLANE
P1', P2' = CONJUGATE POINTS IN WAFER OR IMAGE PLANE

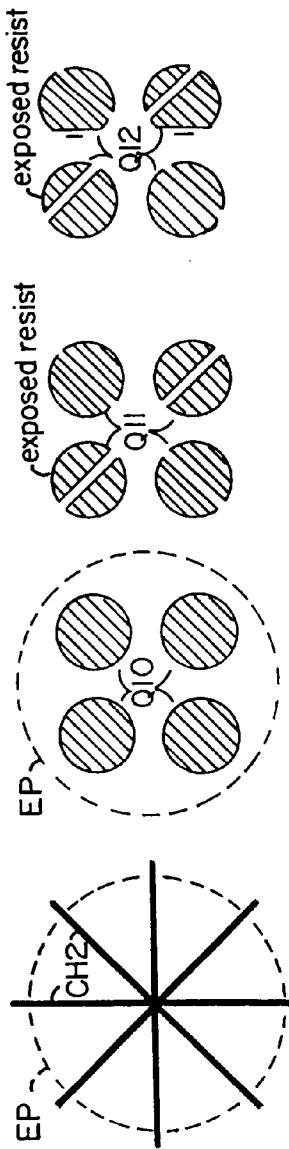
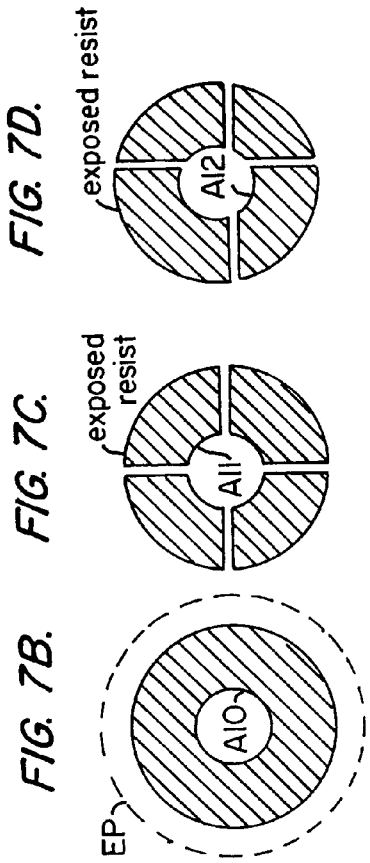

EP = BOUNDARY OF EXIT PUPIL
CH1, CH2 = CROSS HAIRS IN OBJECT PLANE.
AI0 = ANNULAR ILLUMINATION PATTERN IN RELATION TO EXIP PUPIL EP.
AI1 = ANNULAR ILLUMINATION PATTERN AS PROJECTED ONTO WAFER THROUGH PINHOLE CAMERA AND CROSSHAIRS, CONDENSER ALIGNED AT THIS FIELD POINT.
AI2 = COMBINED CROSS HAIR AND SOURCE MAP FOR A MISALIGNED CONDENSER.
QI0 = QUADRUPLE ILLUMINATION PATTERN IN RELATION TO EXIT PUPIL EP.
QI1 = QUADRUPLE ILLUMINATION AS PROJECTED THROUGH CH2 AND PINHOLE ONTO WAFER. CONDENSER IS ALIGNED AT THIS FIELD POINT.
QI2 = QUADRUPLE ILLUMINATION AS PROJECTED THROUGH CH2 AND PINHOLE ONTO WAFER. CONDENSER IS MISALIGNED AT THIS FIELD POINT.

EP = BOUNDARY OF EXIT PUPIL
EPx,y = AXES CENTERED ON EP
CI2 = CONVENTIONAL ILLUMINATION PATTERN WITH MISALIGNED
 CONDENSER AS PROJECTED ONTO WAFER THRU PINHOLE CAMERA
CIc = CENTER OF CI2
OBS = OBSCURATION IN IMAGING SYSTEM

EP = BOUNDARY OF EXIT PUPIL
RP = RETICLE PATTERN (CHROME PART CENTERED AT FIELD POINT

EP = BOUNDARY OF EXIT PUPIL
EPx,y = AXES CENTERED ON EP
RP = RETICLE PATTERN (IMAGE)
CI2 = CONVENTIONAL ILLUMINATION PATTERN WITH MISALIGNED
    CONDENSER AS PROJECTED ONTO WAFER THRU PINHOLE CAMERA AND RP
CIc = CENTER OF CI2

EP = BOUNDARY OF EXIT PUPIL
EPx,y = AXES CENTERED ON EP
CDR = ONE OF FOUR REGIONS TO MAKE CD MEASUREMENTS
CI2 = CONVENTIONAL ILLUMINATION PATTERN WITH MISALIGNED CONDENSER AS PROJECTED ONTO WAFER THRU PINHOLE CAMERA AND RP
CIc = CENTER OF CI2

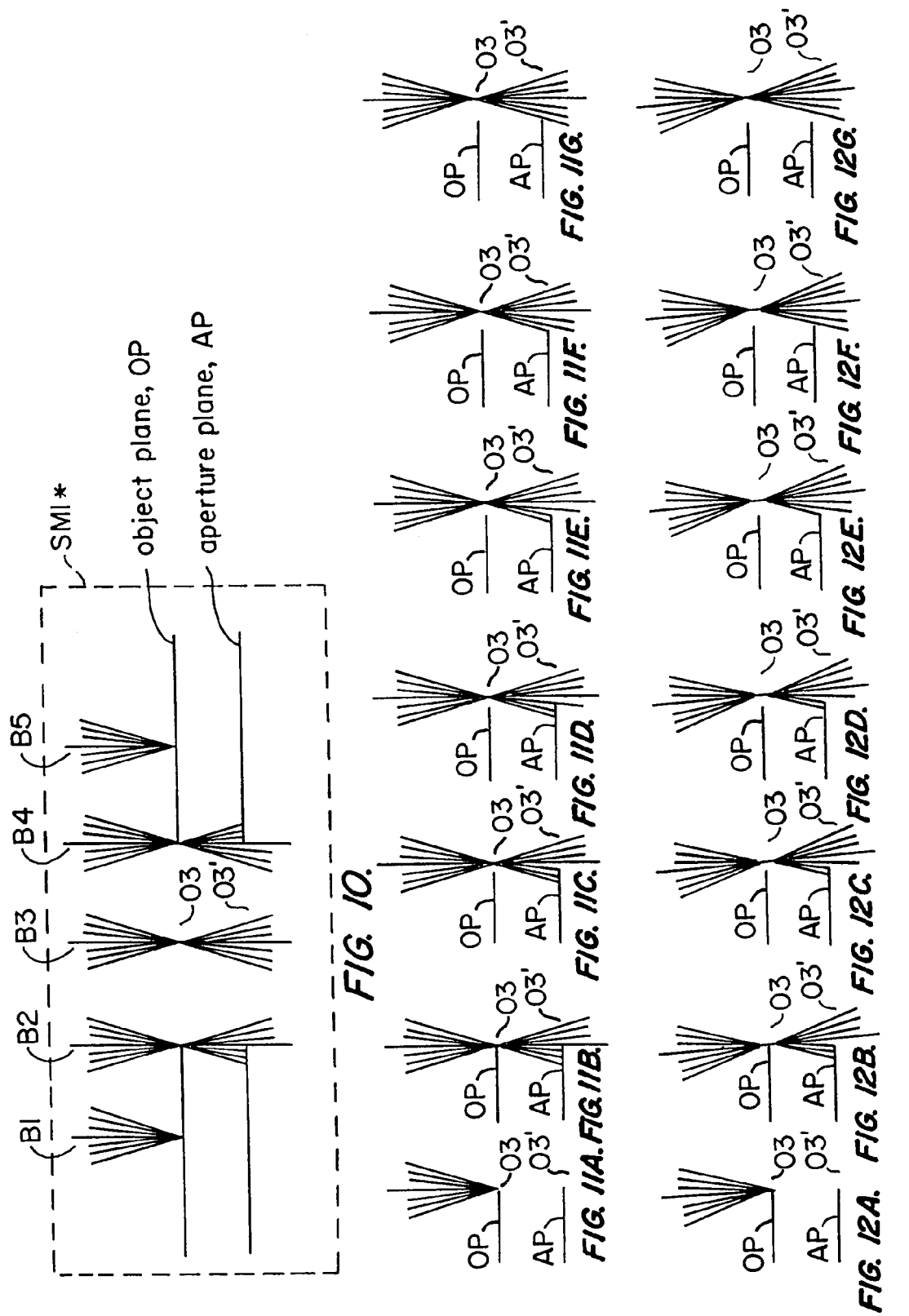

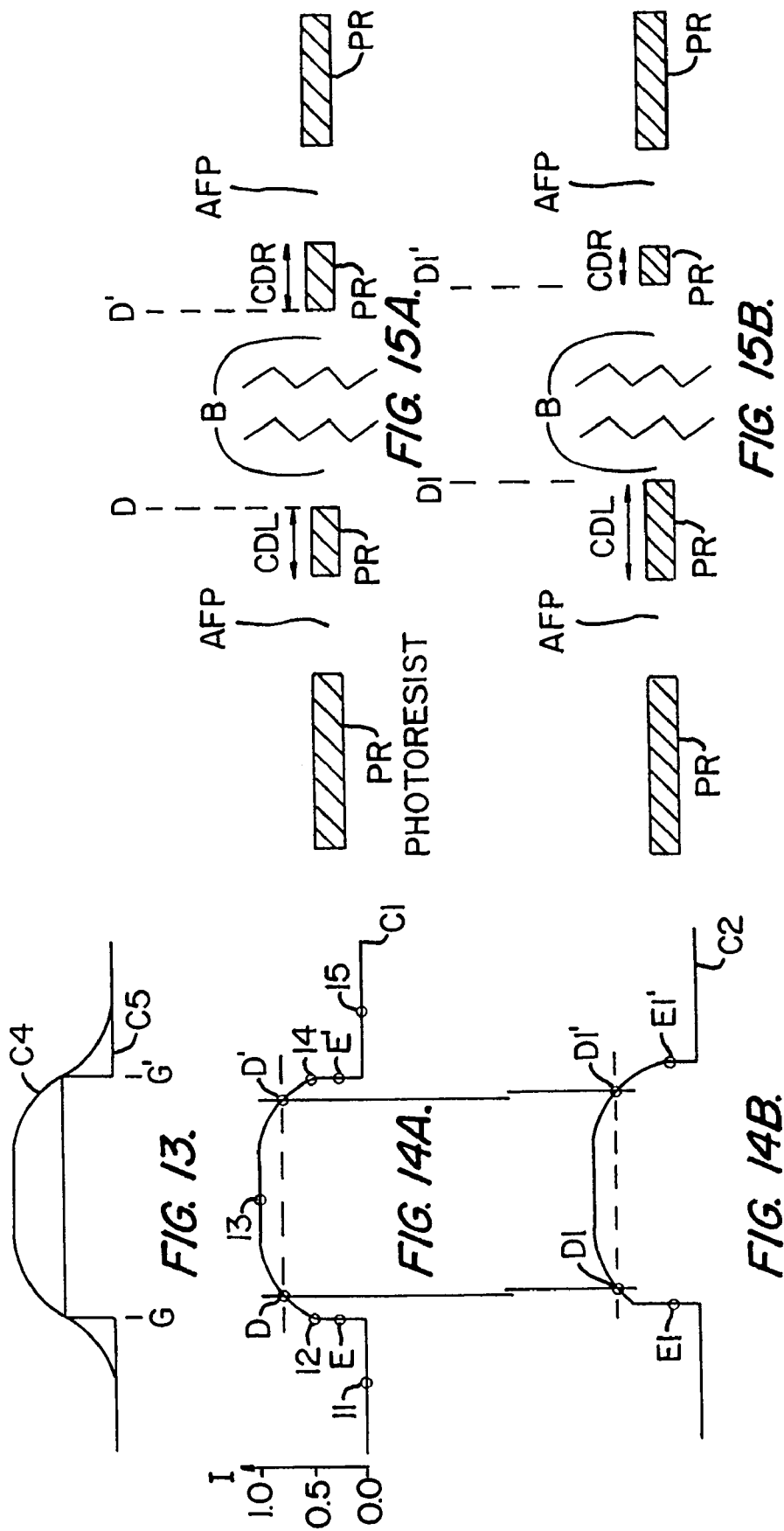

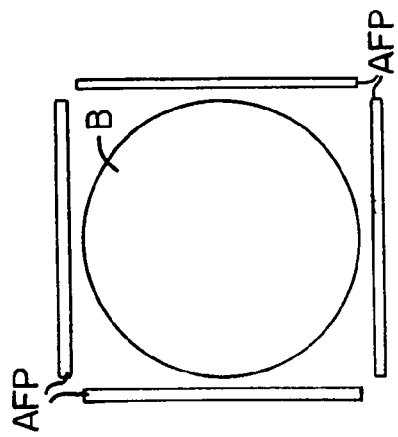
FIG. 19B.
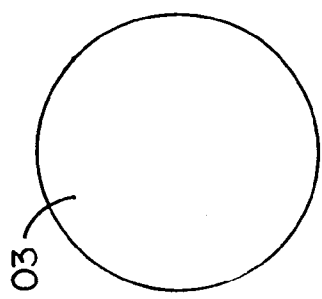
FIG. 19A.
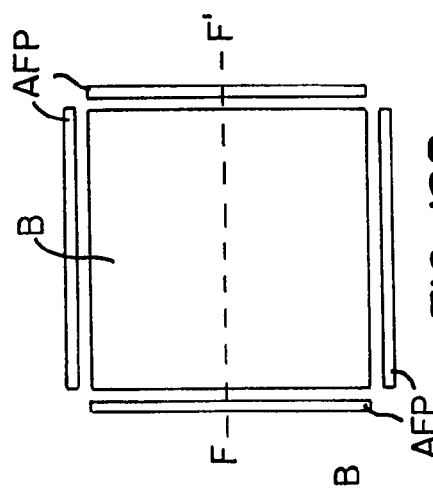
FIG. 18B.
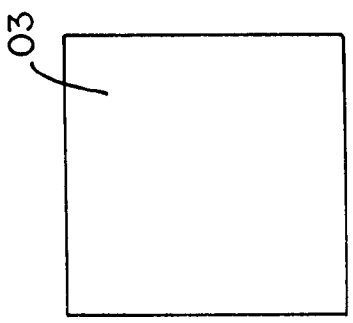
FIG. 18A.
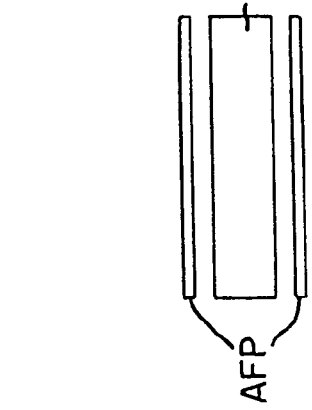
FIG. 17B.
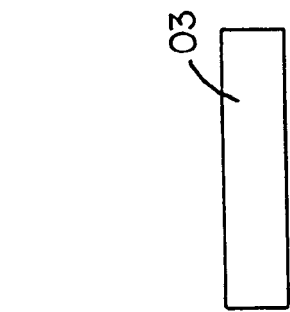
FIG. 17A.
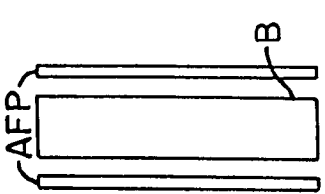
FIG. 16C.
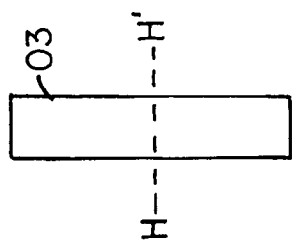
FIG. 16A.
FIG. 16B.

EP = BOUNDARY OF EXIT PUPIL
MP = MASK PLANE PATTERN CONSISTING OF A RECTANGULAR ARRAY OF STREETS AND ALLEYS.
DARK AREAS = CHROME.
WPlm = WAFER PLANE IMAGE OF MP
FIG. 20D = BLOW UP OF SMALL SECTION OF 20C SHOWING THE CRITICAL DIMENSION MEASUREMENT MADE.
FIG. 20E = DOSE (J) VS. CRITICAL DIMENSION (CD) PLOT.

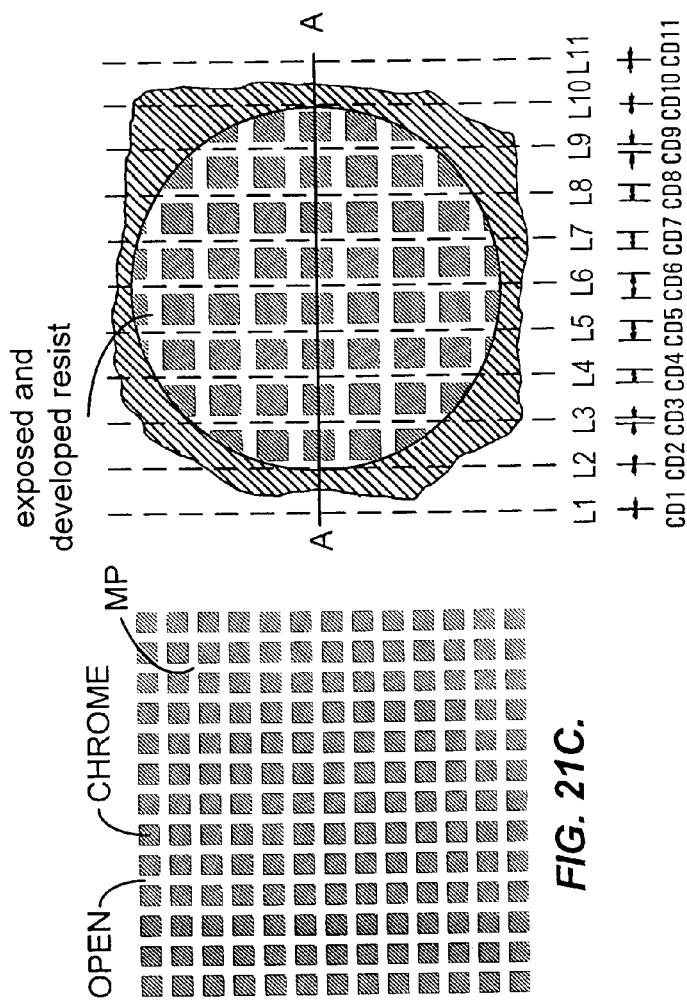
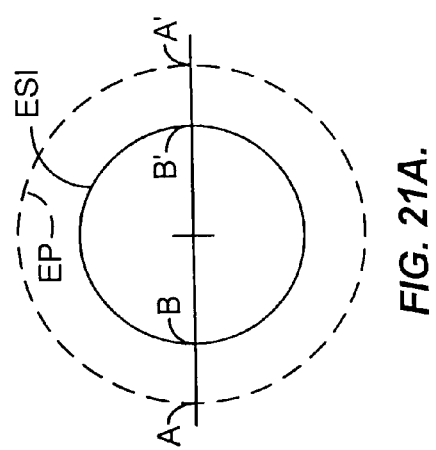
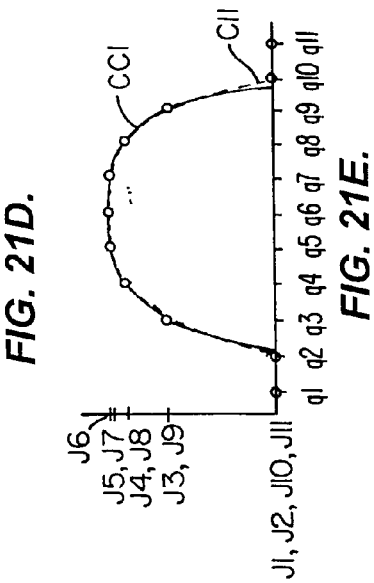
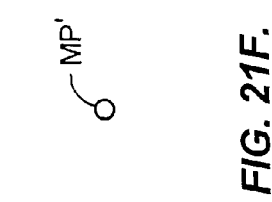
FIG. 21A.
FIG. 21B.
FIG. 21C.
FIG. 21D.
FIG. 21E.
FIG. 21F.

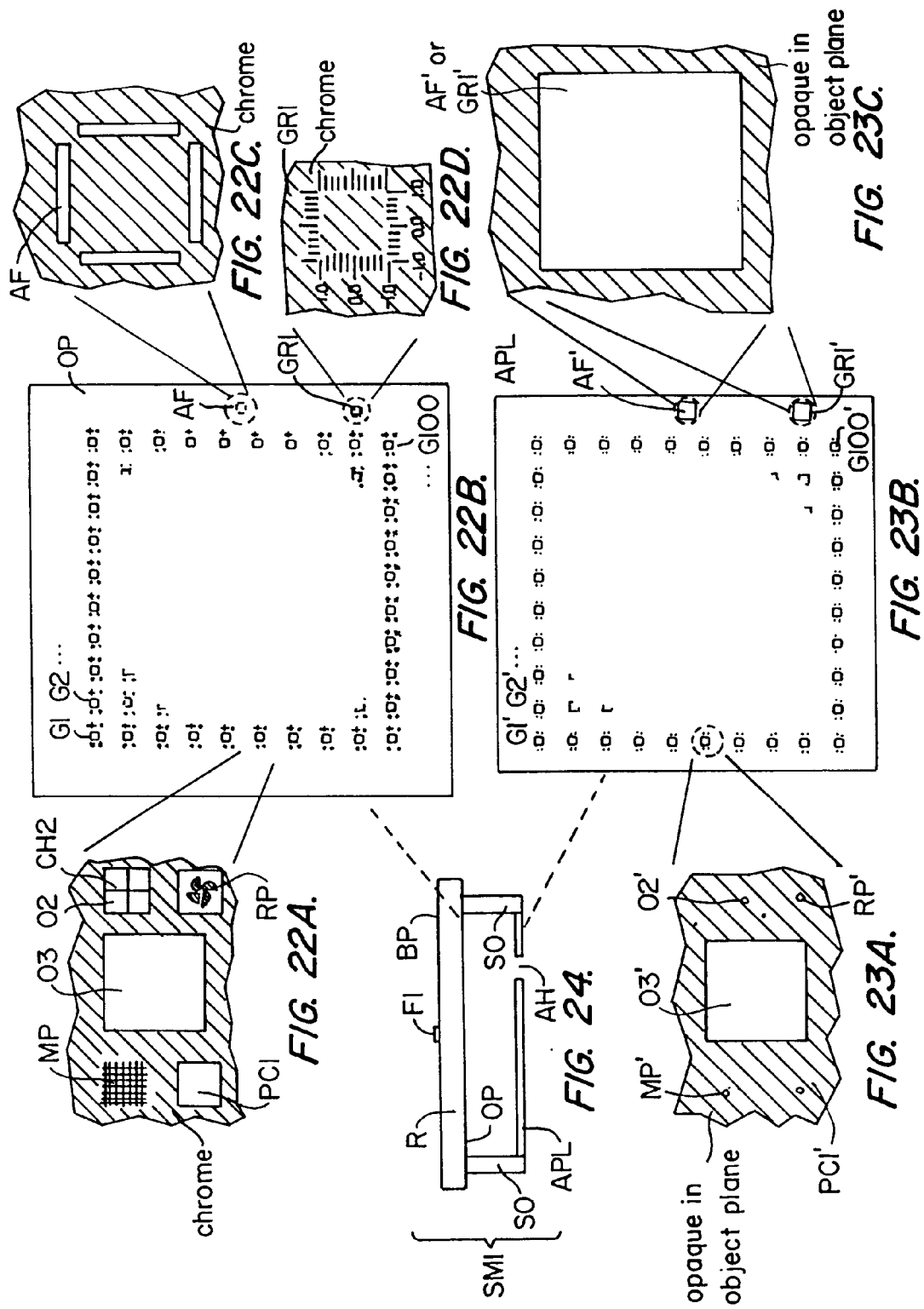

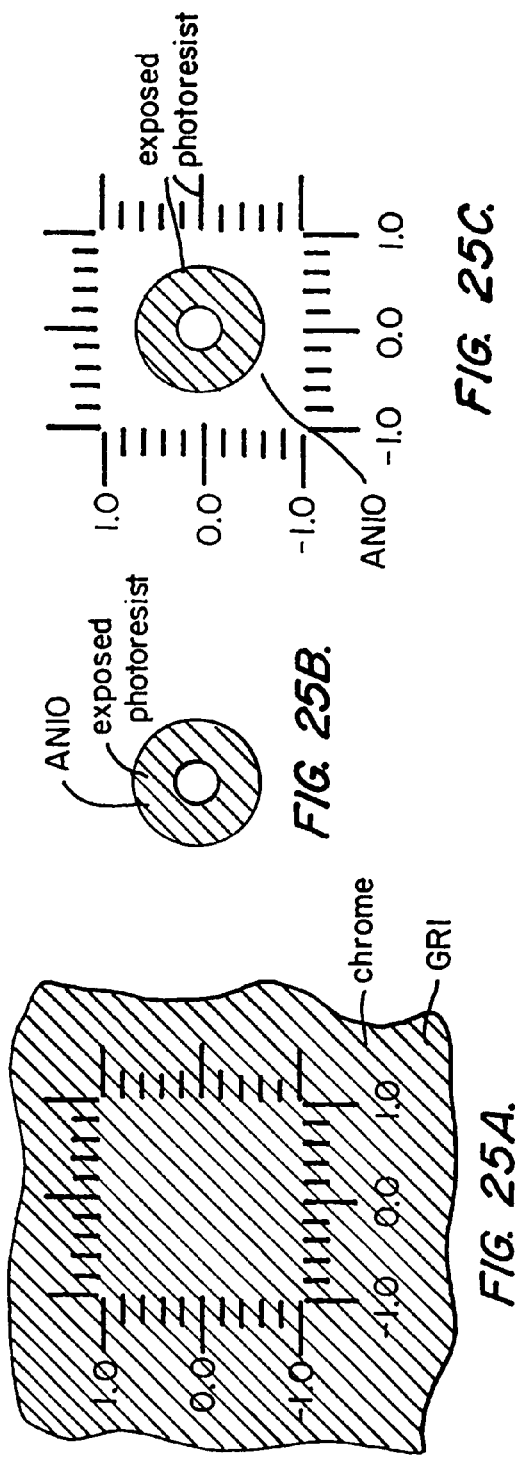

Reference frame in reticle coordinates.
all units = microns 0 (0, 0)
1 (830, 0)
2 (2158, 0)
3 (2600, 0)
4 (2600, 436)
5 (2600, 1528)
6 (2600, 1968)
7 (2158, 1968)
8 (830, 1968)
9 (0, 1968)
10 (0, 374)
11 (0, 294)
12 (204, 266)
13 (204, 572)
C (1512, 984)
frames are 80 thick
text box is 334 x 114
bar codes are 200 x 60
 boxes on 120 pitch, 10 sites
0 = origin
C = feature center, this is location that is placed on nominal pinhole center.

J1 < J2 < J3

IN-SITU SOURCE METROLOGY INSTRUMENT AND METHOD OF USE

CROSS-REFERENCES TO RELATED APPLICATIONS

This application is a continuation in part of U.S. patent application Ser. No. 09/247,446 filed Feb. 10, 1999 now U.S. Pat. No. 6,356,345, issued Feb. 10, 1999, entitled "In-Situ Source Metrology Instrument and Method of Use," the contents of which are incorporated by reference.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

FIG. 2 illustrates typical Kohler illumination. The effective source (here a lamp LA) is imaged to the aperture stop AS as LA'. Placing film or other photosensitive material at AS will record the intensity distribution as in J. Kirk, C., *Microlithography World*, No. 6, 6:25 (1997). However, the aperture stop is not generally accessible for this sort of diagnostic. For a circularly symmetric source, the σ value which is defined as:

$$\sigma = NA_{ill}/NA_o$$

where:

σ partial coherence of effective source $NA_{ill}$ numerical aperture of the cone of radiation defining the effective source.

$NA_o$ numerical aperture of the aperture stop as seen from the object side (entrance pupil)

is generally <1. Thus the aperture stop is typically underfilled by the effective source. Control of σ is important for maintaining uniformity of small (~diffraction limited resolution) features. Y. Borodovsky, *Optical /Laser Microlithography VIII*, SPIE 1440:750 (1995) discusses a study wherein σ variation across a stepper FOV resulted in significant linewidth variations. Y. Borodovsky, *Optical/Laser Microlithography VIII*, SPIE 1440:750 (1995) used micro structures (400 nm spaces at various pitches) and indirectly inferred through image simulations the value of cy. Such an indirect measurement can only capture one or at most a few parameters characterizing the effective source luminous intensity. A direct method of measurement that separates other effects such as imaging objective aberrations, dose control, photoresist development characteristics and provides a more complete set of information is desirable.

Another effect the effective source has on printed imagery arises from decentration of the effective source with respect to the system exit pupil. This also goes by the name of condenser aberrations or alignment. D. Peters, *Interface 85*, Kodak Publ. No. G-154, 66–72 (1985) describes how condenser alignment leads to printed image distortion that is a function of defocus. It is important to separate this from distortion which is due to the system imaging objective alone. Thus the distortion correcting techniques of McArthur and Smith, U.S. Patent No. 5,929,991; McArthur et al., U.S. Pat. No. 5,392,119; and Macdonald et al., U.S. Pat. No. 5,136,413 would benefit from a metrology tool that could clearly distinguish that part of the distortion due to condenser setup and that part due to the imaging objective alone.

Hasan et al., *IEEE Transactions on Electron Devices* ED-27, #12 (1980) and Dusa and Nicolau, *Optical/Laser Microlithography II*, SPIE 1088:354 (1989) utilized electrical methods (van der Pauw resistors) to ascertain condenser alignment. This technique utilized microstructures at different wafer z positions to infer the z dependent distortion described in D. Peters, *Interface 85*, Kodak Publ. No. G-154, 66–72 (1985). As such, this technique relied on subtracting out the imaging objective contribution to distortion to arrive at condenser misalignments. A measurement technique that intrinsically and clearly separated imaging objective and condenser effects is desirable.

Other techniques aimed at diagnosing imaging objective behavior, not the effective source distribution include: an in situ interferometer for wavefront determination (Smith and McArthur, Apparatus, Method of Measurement, and Method of Data Analysis for Correction of Optical System, U.S. Patent no. 5,828,455 issued Oct. 27, 1998 and Smith and McArthur, Apparatus, Method of Measurement, and Method of Data Analysis for Correction of Optical System, U.S. Patent No. 5,978,085 issued Nov. 2, 1999), K. Freischlad, *Optical/Laser Microlithography VIII*, SPIE 2440:743 (1995), describes an interferometer (noninsitu) for stepper diagnosis, J. W. Gemmink, *Optical/Laser Microlithography II*, SPIE 1088:220 (1989) and Brunner et al., *Optical/Laser Microlithography VII*, SPIE 2197:541 (1994), describe techniques for determining optimal focus; C. Huang, *Optical/Laser Microlithography VIII*, SPIE 2440:735 (1995), describes techniques for determining optimal focus and astigmatism only; and Dusa and Nicolau, *Optical/Laser Microlithography II*, SPIE 1088:354 (1989), describes general field characterization and qualification techniques.

The current invention is an insitu device that directly measures the luminous intensity (energy per unit solid angle) of the effective source, it's alignment, shape, and size. As such it can be readily employed in the devices described by Sato et al., U.S. Pat. No. 4,861,148; T. Whitney, U.S. Pat. No. 5,386,319; K. Jain, U.S. Pat. No. 5,285,236; Yoshitake et al., *Optical/Laser Microlithography IV*, SPIE 1463:678 (1991); Yudong et al., *Optical/Laser Microlithography IV*, SPIE 1463:688 (1991); van den Brink et al., *Optical/Laser Microlithography IV*, SPIE 1463:709 (1991); Unger and DiSessa, *Optical/Laser Microlithography IV*, SPIE 1463:725 (1991); and Feldman and King, U.S. Pat. No. 3,819,265.

BRIEF SUMMARY OF THE INVENTION

A process of measuring the radiant intensity profile of an effective source of an projection image system that has an effective source, an object plane, an imaging objective, an exit pupil, and an image plane. An array of field points is provided on the object plane of the projection imaging system. A corresponding array of aperture plane apertures is displaced from the object plane a sufficient distance to image the effective source, the array of corresponding object plane apertures corresponding to the field points on the object plane. The improved process consists of selecting at least one field point and a corresponding aperture plane aperture and projecting a plurality of images of the selected field point through the corresponding selected aperture plane aperture at a plurality of various intensities of the effective source. This produces at the image plane a corresponding plurality of images of the effective source image at the selected field point. The effective source images of the selected field points are recorded at the image plane to produce recorded images for each of the plurality of various intensities. By analyzing the recorded images of the effective source it is possible to determine a radiant intensity profile of the image source at the selected field point.

BRIEF DESCRIPTION OF THE DRAWINGS

FIGS. 6a–6d show one technique for assessing source alignment with respect to the exit pupil.

FIGS. 7a–d show another technique for assessing source alignment with respect to the exit pupil.

FIG. 10 is a section of the SMI and ray bundles passing through 3 points that is used for a fifth technique for assessing source alignment with respect to the exit pupil.

FIGS. 11a–g shows ray bundles of a properly aligned source at transversely displaced locations relative the left edge.

FIGS. 12a–g shows ray bundles of a misaligned source at transversely displaced locations relative the left edge.

FIG. 13 shows the object plane transmission and aperture hole effective transmission for an aligned source using the configuration of FIG. 10.

FIGS. 14a–b show respectively the projected intensity pattern for an aligned source and a misaligned one.

FIGS. 15a–b show developed photoresist profiles of FIGS. 14a–b and auxiliary alignment marks.

FIG. 16a shows an object plane pattern in plan view for measuring the X offset of the effective source.

FIG. 16b shows the object plane and aperture plane patterns of FIG. 16a in cross section HH'.

FIG. 16c shows the projected pattern resulting from FIG. 16b as well as auxiliary alignment marks AFP.

FIG. 17a is an object plane and aperture plane pattern for measuring Y offsets of the effective source.

FIG. 17b shows the projected pattern resulting from FIG. 17a and auxiliary alignment marks AFP.

FIG. 18a is an object plane and aperture plane pattern for measuring X and Y offsets of the effective source.

FIG. 18b shows the projected pattern resulting from FIG. 18a and auxiliary alignment marks AFP.

FIG. 19a is an object plane and aperture plane pattern for measuring X and Y offsets of the effective source.

FIG. 19b shows the projected pattern resulting from FIG. 18a and auxiliary alignment marks AFP.

FIGS. 21a–f illustrate use of a technique for quantifying the effective source using CD measurements.

FIGS. 22a–d is an exemplary object plane layout for the SMI.

FIGS. 23a–c is the corresponding exemplary aperture plane layout for the SMI.

FIG. 24 is a schematic side view of the SMI.

FIGS. 25a–c illustrates another technique for displaying and measuring the effective source luminous intensity.

FIG. 26 is another object plane pattern that could be used in the schematic illustrated in FIGS. 25a–c.

DETAILED DESCRIPTION OF THE INVENTION

Figure 1:
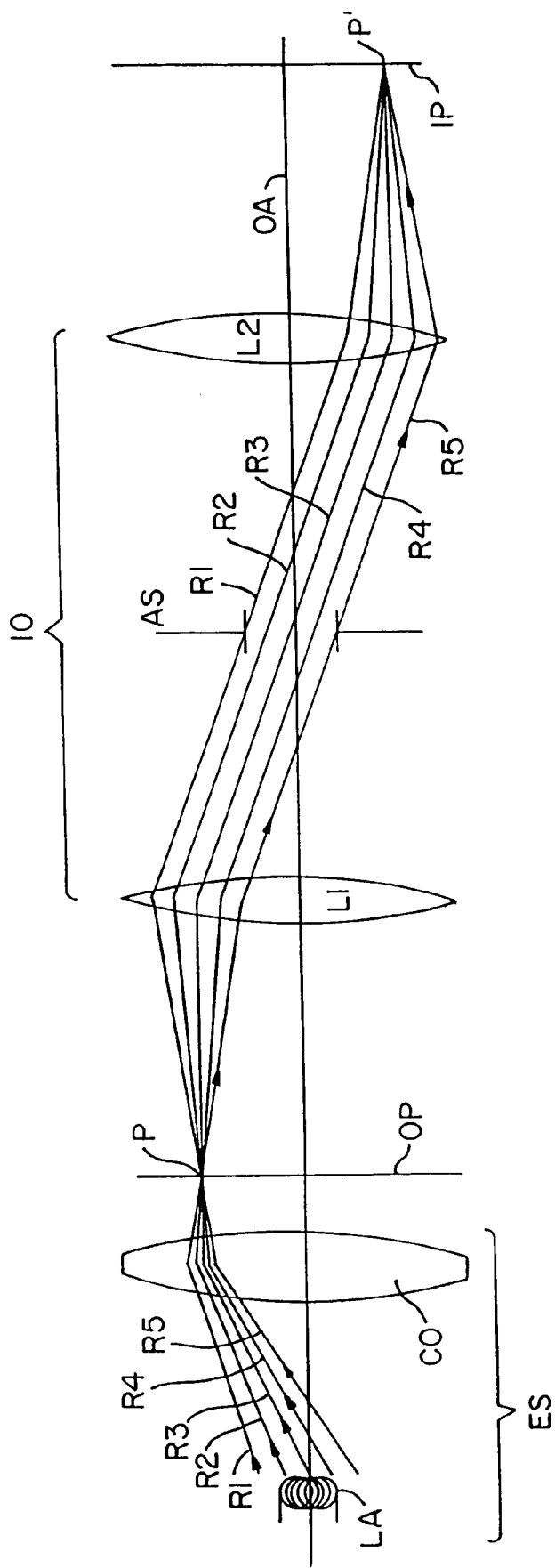
FIG. 1 is a functional schematic of a projection imaging system beamtrain showing the raypaths arising from a single point in the object plane.
Figure 2:
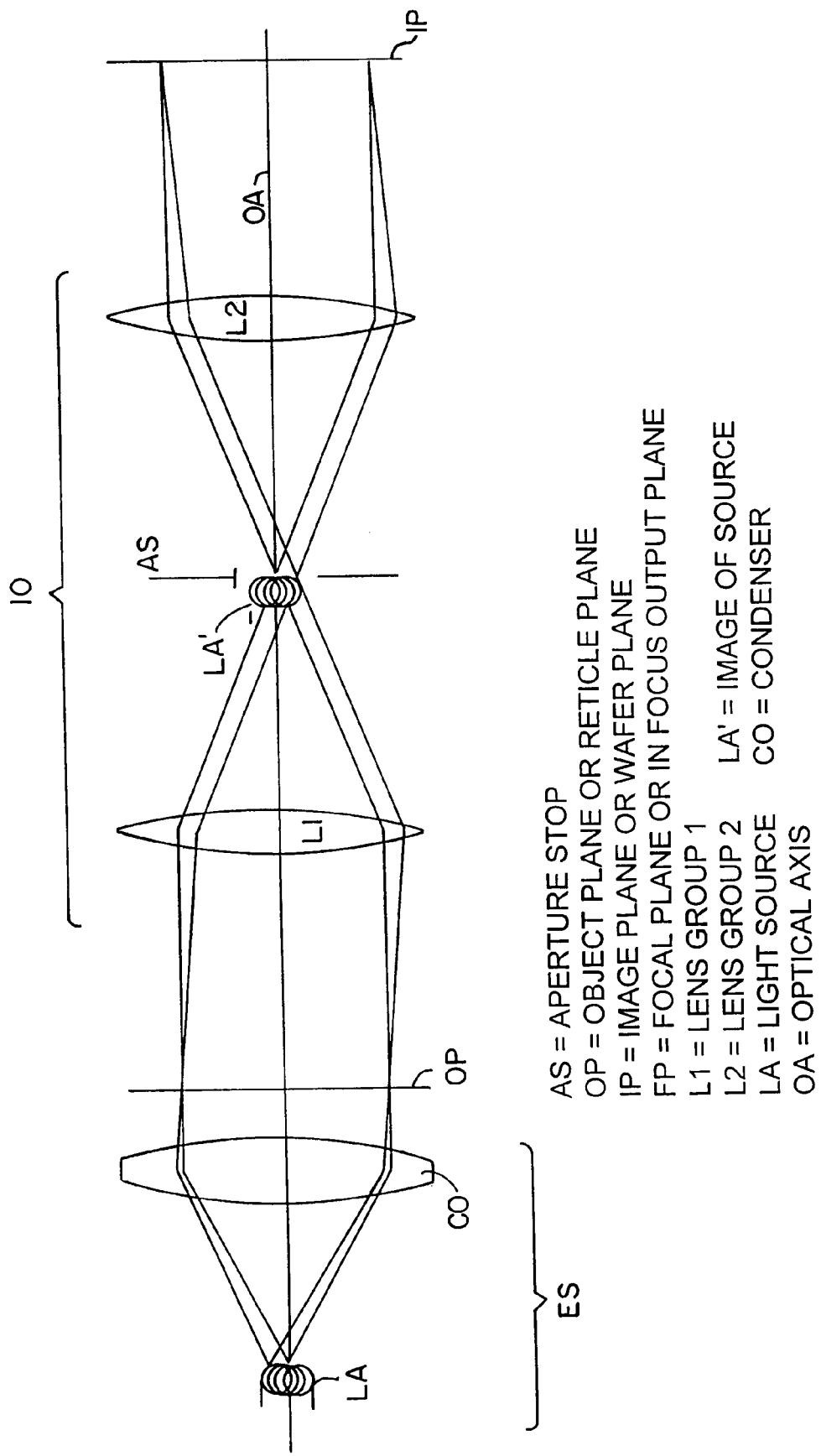
FIG. 2 is a functional schematic of a projection imaging system beamtrain showing the raypaths arising from two distinct points in the effective source.

FIG. 1 is a functional schematic of a projection imaging system beamtrain. Principal optical subsystems are effective source, ES (drawn as a lamp LA and condensing lens CO), imaging objective, IO (consisting of lens groups L1, L2), and aperture stop AS. Object and image planes are labeled OP and IP respectively. ES is simplified for discussion purposes; in steppers it can contain homogenization rods, fly's eye's, and other beamshaping and scrambling optics.

IO is likewise simplified (see Sato et al., U.S. Pat. No. 4,861,148; E. Glatzel, 1980 *International Lens Design Conference* (*OSA*), SPIE 237:310 (1980); Phillips and Buzawa, 1980 *International Lens Design Conference* (*OSA*), SPIE 237:329 (1980) for more typical imaging objective designs). A point P in object plane OP is typically illuminated by a bundle of rays (of which raypaths R2, R3, R4 are examples) that underfill the aperture stop AS. In microlithographic applications, this is done to control image contrast. If the effective source ES is properly aligned, then the light distribution is centered within aperture stop AS and the rays converging on point P' are centered in the exit pupil which is telecentric. Having the effective source centered in a telecentric output pupil means there is no distortion that is a function of defocus (shifts in the location of plane IP), (see D. Peters, *Interface* 85, Kodak Publ. No. G-154, 66–72 (1985) and Goodman et al., *Optical/Laser Microlithography*, SPIE 922:108 (1988)). In FIG. 1, the effective source is centered in the exit pupil. Decentration of the source with respect to the exit pupil would occur if lamp LA were shifted so that now only raypaths R1, R2 and R3 are illuminated while R4 and R5 are not illuminated. One of the objects of this invention is to directly quantify such misalignment of the effective source ES with respect to the exit pupil.

Another deleterious imaging effect is the variation in partial coherence across the imaging field. This is known to cause linewidth variation and has been observed (Y. Borodovsky, *Optical /Laser Microlithography VIII*, SPIE 1440:750 (1995)). The present invention can accurately measure this quantity.

Figure 3:
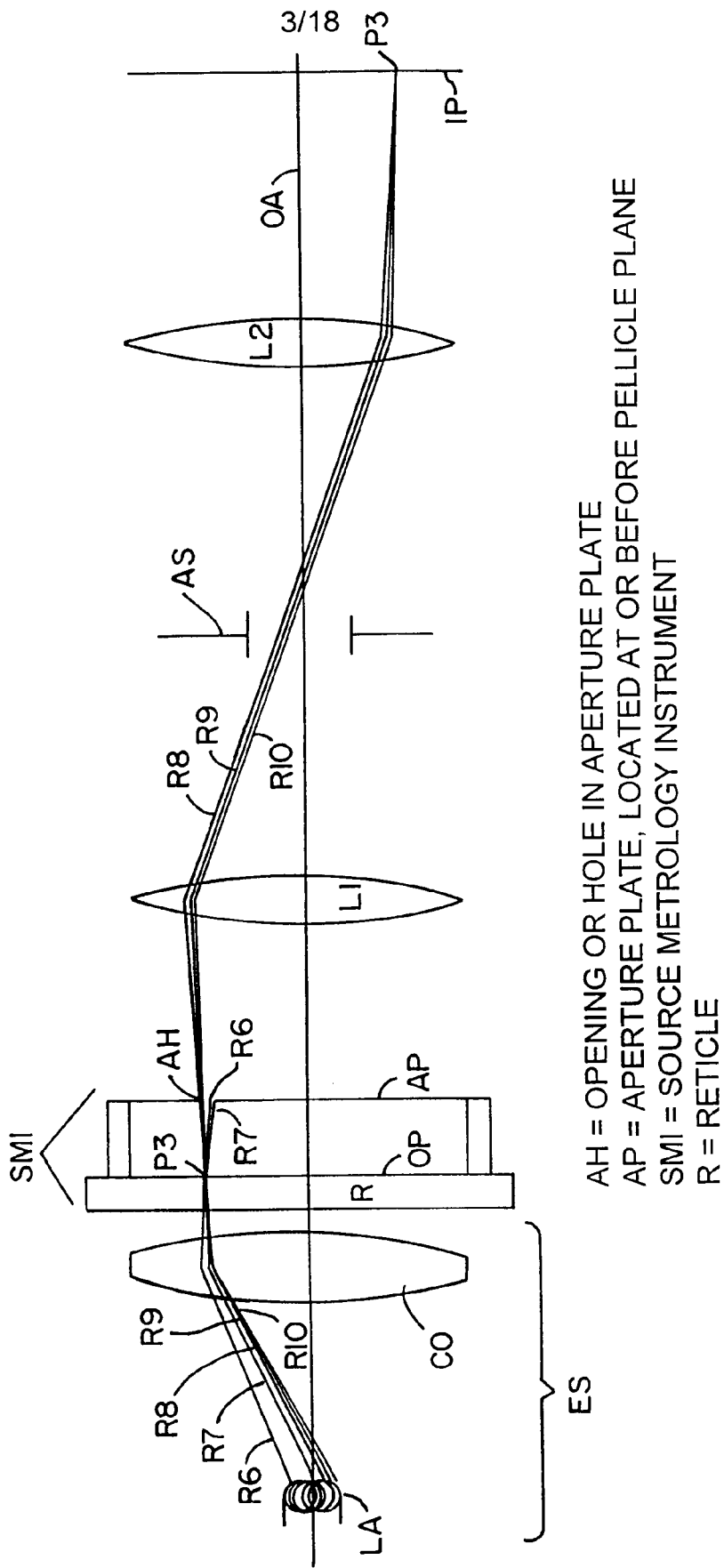
FIG. 3 is a functional schematic of a projection imaging system beamtrain with the SMI inserted showing the raypaths arising from a single point in the object plane.
Figures 4A, 4B:
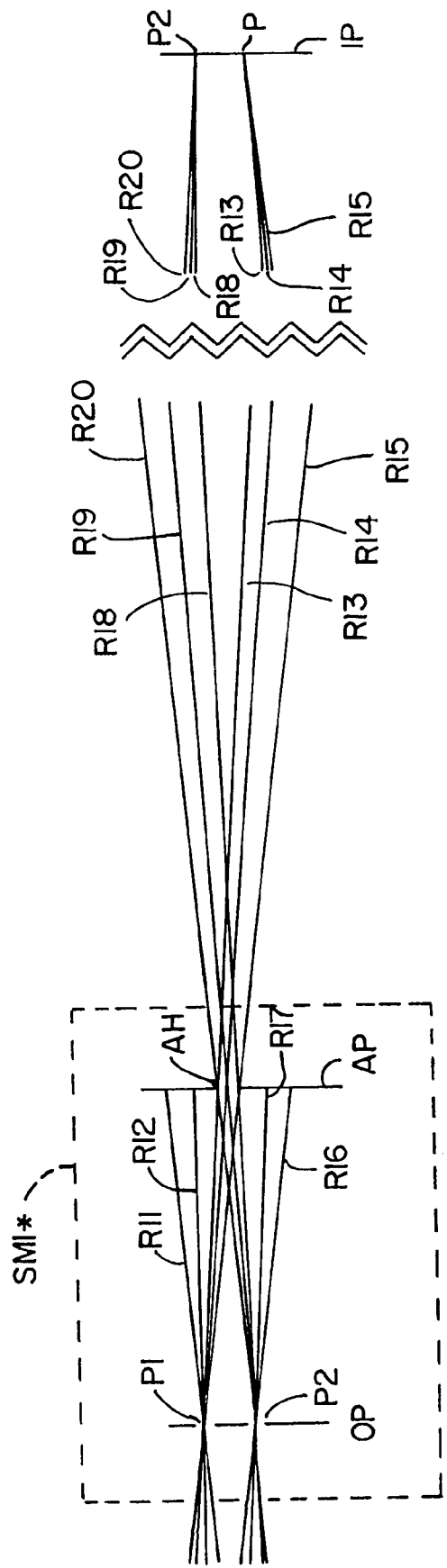
FIG. 4a shows the ray paths arising from two nearby points in the object plane that pass through a common aperture hole.
FIG. 4b shows the rays and nearby points of FIG. 4a as relayed to the image plane.
Figure 5:
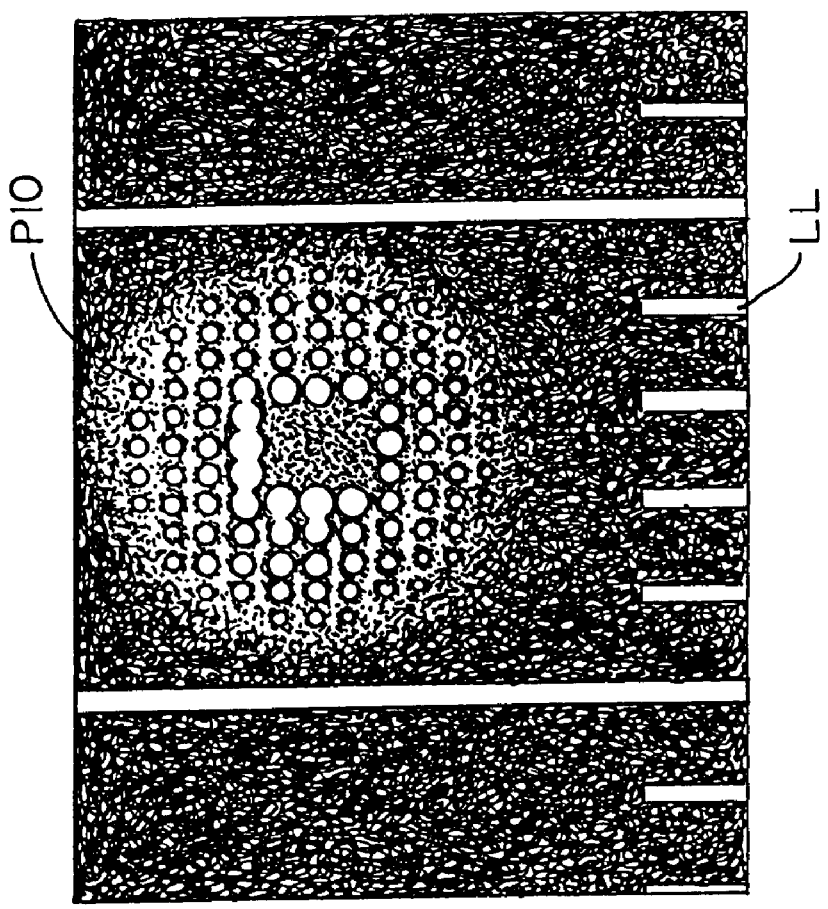
FIG. 5 is a photo of the effective source of a projection imaging system as taken by this invention.

FIG. 3 shows the basic mechanism for forming images of effective source ES. Source metrology instrument, SMI, consists of reticle R, and aperture plate AP having an aperture hole or opening, AH in it. Raypaths R6–R10 emanating from ES and passing through point P3 of the object plane OP strike aperture plate AP with paths R6, R7 terminating there with paths R8, R9, R10 passing through and converging at the image point conjugate to P3, namely P3'. So there is a bundle of raypaths, of which R8, R10 are marginal and R9 chief raypaths, emanating from only a portion of effective source ES that make up image point P3'. R9 is a chief ray path in the sense that it passes through the center of aperture hole AH. Thus the intensity of light at P3' is proportional to the luminous intensity (power per unit solid angle) of the portion of effective source ES passing through object plane point P3 and aperture hole AH. FIG. 4*a* is a closeup of a section of source metrology instrument, SMI*, showing two nearby points, P1+P2, and corresponding raypaths from ES (not shown) convergent thereon. The effect of aperture hole AH is to allow only a portion of the raypaths emanating from effective source ES (not shown) to pass and reform in image plane IP (FIG. 4*b*) at conjugate points P1'+P2'. Since different parts of the effective source are imaged at points P1' and P2', we get an image of the effective source (blurred only by the size of aperture AH and diffraction effects) at image plane IP. This is obtained by placing a photoresist coated wafer at IP, exposing with the SMI in place, and developing the wafer. The result of this process is illustrated in FIG. 5 which shows the image of the effective source as produced with an SMI according to this technique. Exposed pattern P10 consists of a pattern of dots of varying intensities. Grid lines LL were put down separately and are 50 micron apart. Projected diameter of the exit pupil is ~240 micron so the partial coherence of P10 as determined by the outer dot to outer dot distance is σ~0.75.

The mathematical description of this image formation process is as follows. Let the following symbols take on the following meanings:

| | |
|---|---|
| $(x_o, y_o)$ | transverse (perpendicular to the optical axis) position of point in the object plane |
| $(x_a, y_a)$ | transverse position of center of aperture hole |
| $z$ | object plane to aperture plane distance |
| $D$ | diameter of aperture hole |
| $M$ | reduction ratio of imaging system (M:1) |
| $(x_i, y_i)$ | position of point $(x_o, y_o)$ mapped to image plane |

The imaging objective maps the object point at $(x_o, y_o)$ to a point on the image plane at $(x_i, y_i) = (x_o/M, y_o/M)$. An inversion merely rotates the pattern by 180 degrees which effect can be accommodated by similarly rotating the image plane coordinate system. Presence of an aperture at point $(x_a, y_a)$ allows only rays from the effective source that are within a cone centered on angle $(q_x, q_y) = ((x_a - x_o)/z, (y_a - y_o)/z)$ and of full cone angle=$D/z$ to pass. These considerations have utilized the paraxial approximation for illustration, exact expressions are readily derivable. The aperture stop ultimately limits the range of incident ray angles reaching the image plane. The above discussion has been limited to object side, telecentric systems but can be easily generalized to include, non-telecentric object side systems and exact mathematical relationships. Diffraction can also be included.

A exemplary practical device constructed along these lines for use in a microlithographic wafer stepper is as follows. So that the entire SMI can be automatically loaded with the normal reticle handling equipment, it's envelope must be no larger than a standard reticle-pellicle combination. FIG. 24 illustrates the general arrangement. A standard dimension reticle plate R has written on the object plane (OP) side the chrome pattern of FIG. 22*b* (shown in further detail in FIGS. 22*a*, 22*c* and 22*d*). It consists of a 10×10 array of pattern groups (G1, G2, . . . , G100), auxiliary alignment fiducial AF, and calibration pattern GR1 spread across the imaging objective field of view. The outer envelope of aperture plate APL is separated from object plane OP with standoffs SO by a distance no greater than the pellicle standoff distance, typically 5 mm. The transverse dimensions of aperture plate APL are no greater than the pellicle size, which are generally less than the reticle size. Aperture plate APL consists of openings arranged in groups (G1', G2', . . . , G100') which are in 1—1 correspondence with the groups in the object plane (FIG. 22*b*). A closeup of an individual object plane group (FIG. 22*a*) shows an opening in chrome, PC1, that when used in combination with an opening in the aperture plate (PC1', FIG. 23*a*) that together comprise a pinhole camera for the effective source. Such a combination was used to make the image of FIG. 5.

Opening PC1 is made large enough that it's edges are not imaged; said differently, the outer edges of PC1 are situated at an angle relative to aperture hole PC1' that falls outside the imaging objective entrance pupil. Mathematically:

z=object plane to aperture plane distance

NAo=numerical aperture of imaging objective on the object side

D=diameter of opening PC1'
R=radius or half width of opening PC1
then R must satisfy the inequality:

$$R > D/2 + z * \tan(\sin^{-1}(NAo)) \quad \text{(eq 1)}$$

if the edge of the PC1 is not to be imaged at all.
Typical values for these quantities would be:
z=5 mm
D=0.10 mm
NAo=0.12=>R>0.655 mm.

Thus in this case, the size of square opening PC1 of FIG. 22a would be greater than 1.31 mm.

Source Centration Metrology—

Having an effective source that is not centered on the exit pupil causes image distortion as a function of defocus (see D. Peters, Interface 85, Kodak Publ. No. G-154, 66–72 (1985) and Goodman et al., *Optical/Laser Microlithography*, SPIE 922:108 (1988)). If the source position relative to the exit pupil is known, the effective source can be adjusted (condenser alignment) to correct this condition. What follows are a number of techniques for measuring source centration.

One technique uses a crosshair (FIG. 22a, CH2) centered over an opening in the aperture plane (FIG. 23a, O2'). The outer clear window, O2, framing crosshair CH2 has a minimum size (set by eq. 1) such that it's edges do not print. Thus only the crosshair blocks light coming from the effective source. The resulting printed image is a cross obstructing portions of the effective source. Since in construction of the SMI the cross is centered on the nominal system exit pupil, we can read off any misalignment by looking for a shift of the source with respect to the printed cross hairs. FIGS. 6a–6d illustrate this mechanism in more detail. FIG. 6a is the crosshair, CH1, and exit pupil, EP, as transferred back to the object plane OP of the SMI. FIG. 6b shows the luminous intensity of the effective source, AI0, centered within the exit pupil EP. The effect of centered source AI0 passing through the object plane crosshair CH1 and an opening in the aperture plane is shown in FIG. 6c where the projected image of the effective source, AI1, now includes obstructions due to the cross hair CH1. The projected image is in the imaging system image plane IP. In a positive resist, the dark region of FIG. 6c would be exposed and developed out. Now should the effective source (AI0 of FIG. 6b) be shifted relative to the exit pupil EP, the resulting printed feature would be FIG. 6d. The shift with respect to the exit pupil can be read off from the relative position of the outer or inner circle of AI2 with respect to the intersection of the imprinted cross hairs.

To be useful with more structured effective source distributions such as the quadrupole source, QI0, of FIG. 7b, a different crosshair arrangement (CH2 of FIG. 7a) could be employed. The corresponding aligned and misaligned effective source images are shown in FIGS. 7c and 7d respectively. Again, the intersection point of the printed cross hairs allows us to determine the position of the effective source relative to the exit pupil.

Figure 8A:
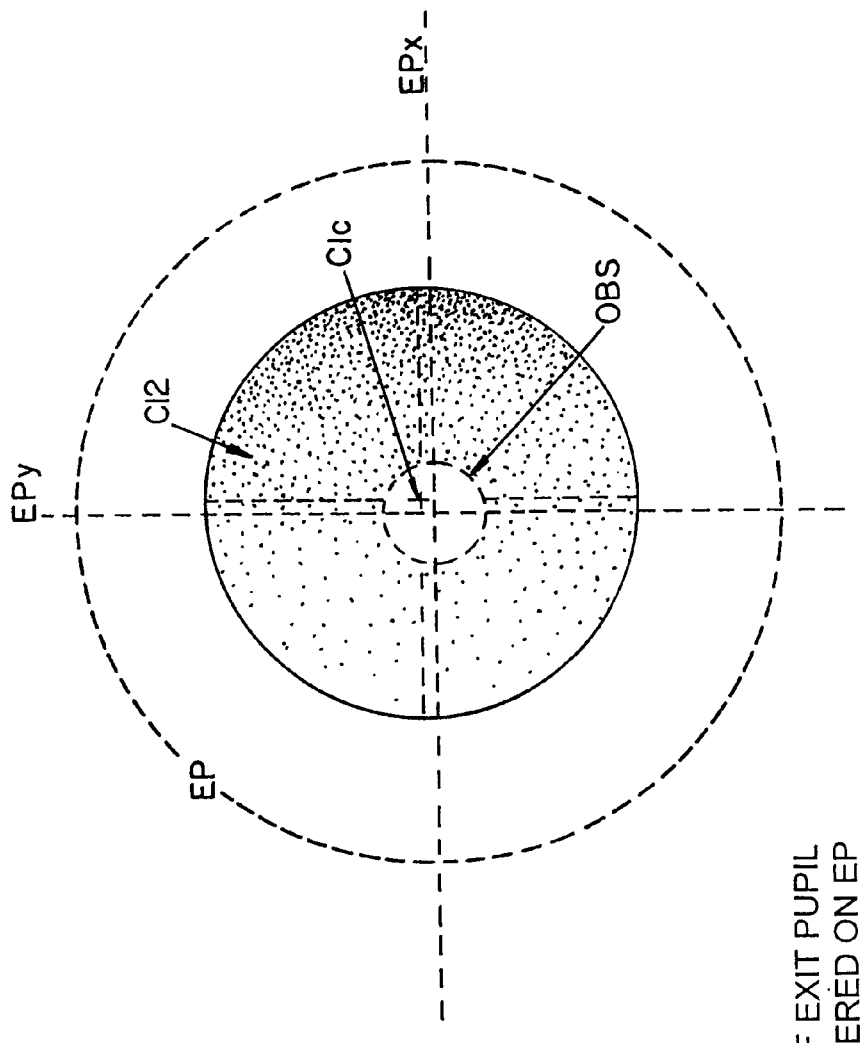
FIGS. 8a–c show yet another technique for assessing source alignment with respect to the exit pupil.
Figure 8B:
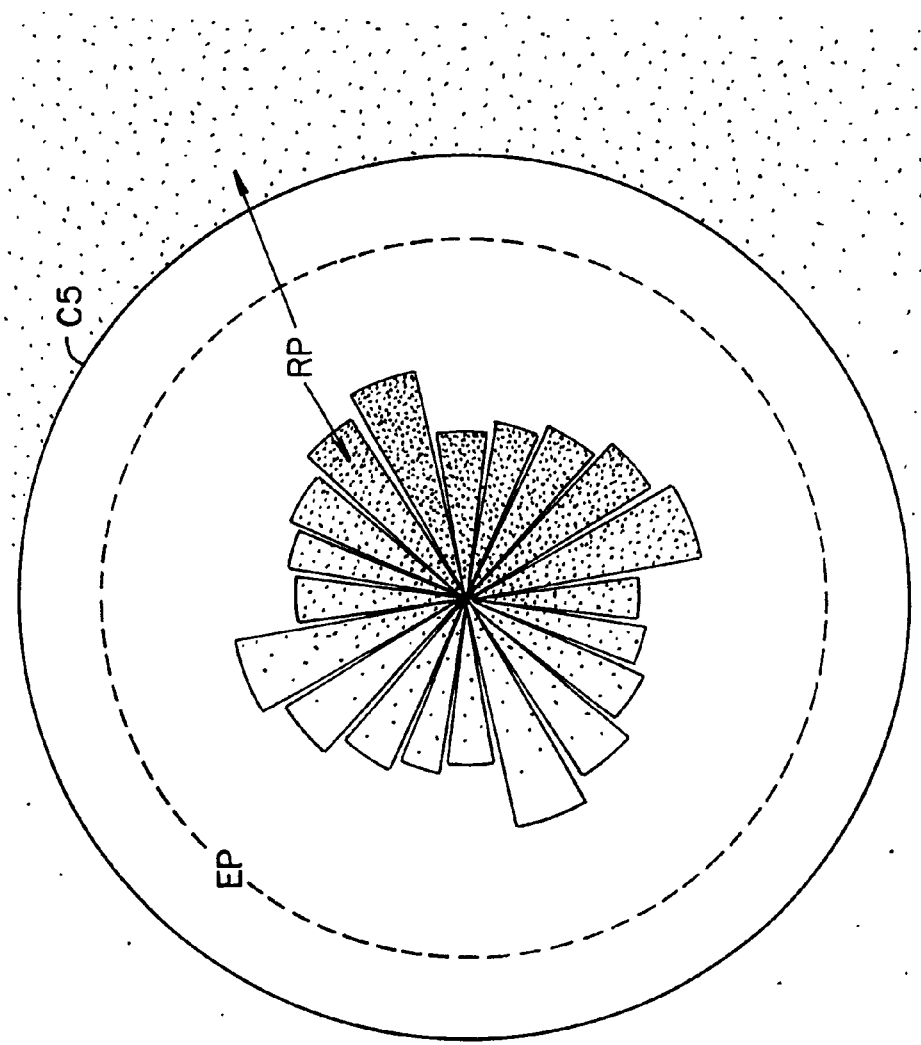
Figure 8C:
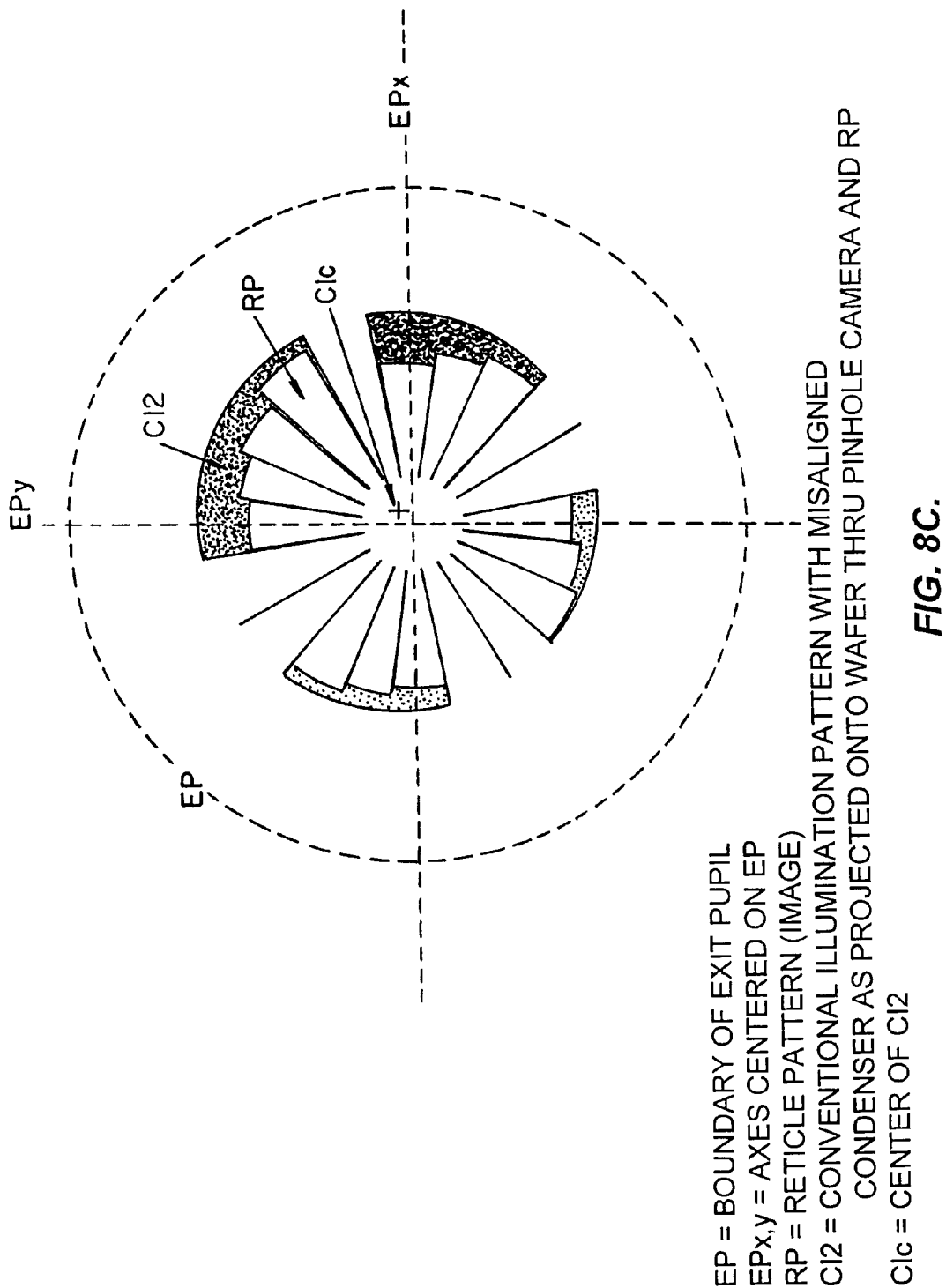

Another centration technique is illustrated in FIGS. 8a–c. The shaded region, CI2, in FIG. 8a shows the exposed image that would be obtained at the wafer from a simple pinhole AH in the aperture plane AP for a stepper with conventional illumination with (partial coherence) σ~0.6, and an obscuration in the imaging objective (OBS). CIc depicts the center of the exposed image and its offset from the center of the exit pupil EP. Epx and Epy lines (lines not imaged) indicate the illumination system is misaligned. FIG. 8b shows the reticle pattern (RP) for measuring effective source centration error. The outer reticle circular aperture, C5, should be significantly larger than the image of the imaging lens's aperture stop backprojected through the pinhole (eq. 1). The mean radius of the arc sections should be approximately σ*NAo*z where:

σ=partial coherence of effective source z=aperture plane AP to object plane OP distance NAo=numerical aperture of the imaging objective on the object side.

Figure 9:
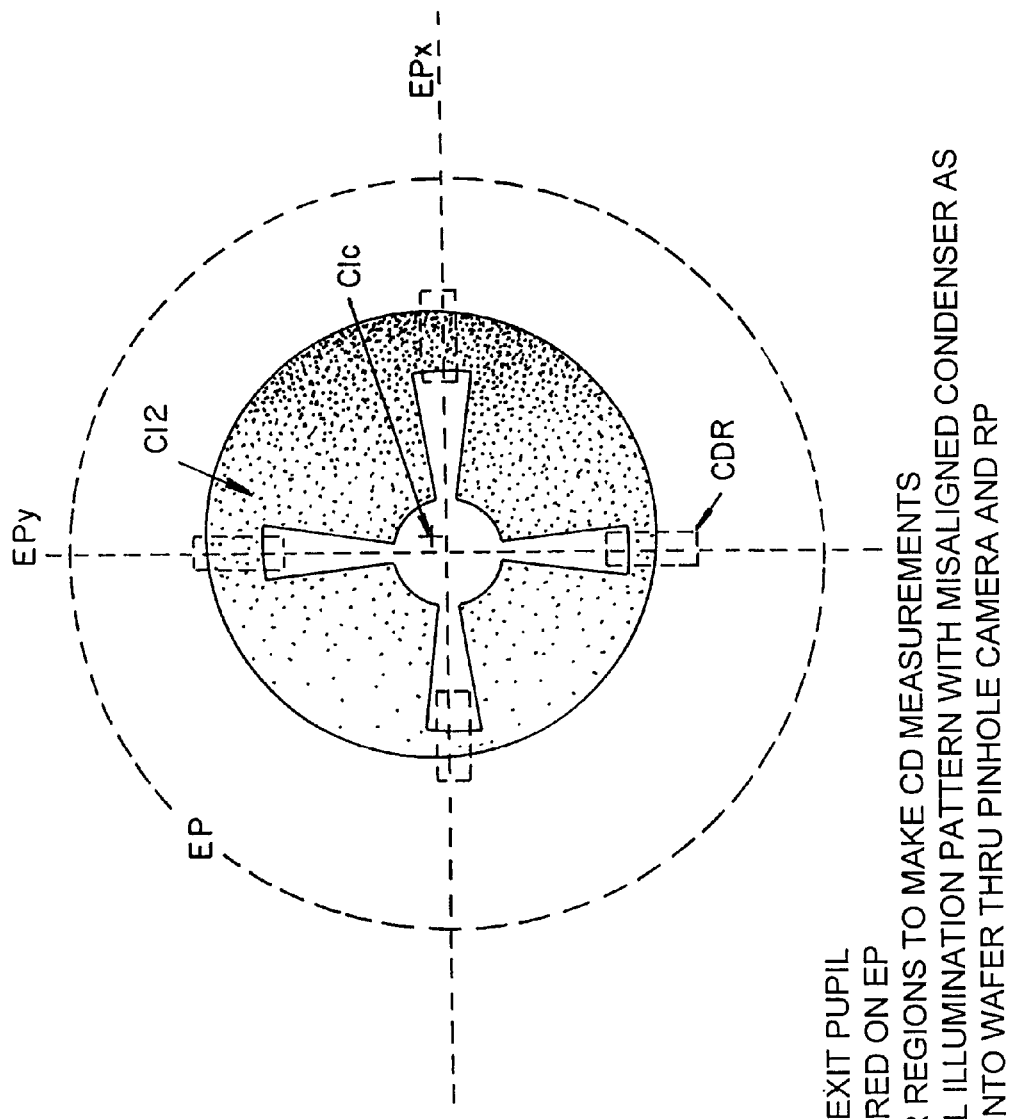
FIG. 9 shows the use of a CD metrology tool to assess effective source centration.

The resulting pattern exposed on a wafer due to the reticle pattern of FIG. 8b and effective source of FIG. 8a is shown in FIG. 8c. This pattern can be manually inspected to look for decentration. By choosing the radius variation and number of arcs in reticle pattern RP appropriately, simply counting the untruncated arcs per quadrant can yield a coarse quantitative estimate of the decentration. Alternatively, the widths of the exposed regions at 0/180 and 90/270 degrees could be measured and differenced to yield a quantitative illumination offset. FIG. 9 shows the appropriate subset of FIG. 8c (0, 90, 180 and 170 degrees) to measure with standard CD measurement tools. The 4 CD measurements are taken at the areas indicated by dashed boxes (FIG. 9) and are $CD_0$, $CD_{90}$, $CD_{180}$ and $CD_{270}$, the subscript corresponding the angle the measurement is taken at relative to the pattern center. Angular offsets of the exit pupil, Δθx and Δθy are then given approximately by:

$$\Delta\theta x = M^2/z * (CD_0 - CD_{180})$$

$$\Delta\theta y = M^2/z * (CD_{90} - CD_{270}).$$

The structure of FIG. 8b and corresponding aperture hole are incorporated in the exemplary SMI of FIGS. 22 and 23 (specifically, RP in FIG. 22a and RP' in FIG. 23a).

Another technique for determining effective source centration is implemented in FIGS. 22 and 23. Opening O3 (FIG. 22a) in object plane OP sits directly above (or along the chief ray trajectory in non-telecentric systems) an identically sized opening O3' (FIG. 23a) located on the aperture plate APL. These are spread out in a 10×10 group over both object plane (OP) and aperture plate (APL). In addition there are alignment fiducials AF (detailed in FIG. 22c) in the object plane OP and a corresponding oversized window (AF' detailed in FIG. 23c) directly below AF in the aperture plate APL.

The principle of operation of this technique is depicted in FIGS. 10–15 and will first be briefly described. When the effective source is centered on the nominal exit pupil, then the combination of O3 and O3' makes a first image (when slightly overexposed) that is centered on the location of the conjugate image of O3 alone (that is O3 if aperture plane AP was unobstructed). A second image still more overexposed will yield the conjugate of O3. Thus the two images will be centered at the same location. When the effective source is decentered with respect to the exit pupil, the first image will be shifted with respect to the second image. This shift is detected by printing alignment fiducials AF (FIG. 22c) producing a net pattern similar to FIG. 18b and then measuring the shift of the center box B with respect to printed alignment fiducials AFP using a CD metrology tool.

FIG. 10 is a section of the SMI, denoted SMI*, and ray bundles (B1–B5) arising from an effective source centered on the nominal exit pupil passing through 5 points in the object plane. Imaging system chief rays (rays that pass through the center of the aperture stop) are denoted by their extra length. O3 is a section of opening O3 of FIG. 22a while O3' is the corresponding cross section of opening O3' of FIG. 23a. B1 is completely outside the opening O3 so the intensity projected to image plane IP is zero corresponding to point I1 on intensity curve C1 of FIG. 14a. Bundle B2 is incident just inside the left edge of opening O3, but approximately half of the rays in the bundle are outside the clear opening O3'; therefore, the intensity of light reaching the image plane is approximately half of what it would be if all the rays were passed. This corresponds to point I2 of intensity curve C1. Bundle B3 is incident on the middle of opening O3 and all of it's rays get through openings O3 and O3'. This corresponds to point I3 of intensity curve C1. Bundle B4 passes just inside the right edge of O3 and corresponds to point I4 of intensity curve C1. Bundle B5 passes right of the right edge of opening I3 and corresponds to point I5 of intensity curve C1. FIGS. 11a–11g illustrate other ray bundles originating from an effective source that is aligned with respect to the nominal exit pupil and incident in the neighborhood of the left edge of opening O3. Note that as the point of incidence in the plane of O3 moves to the right, a gradually increasing # of rays (e.g. amount of light) is allowed to pass through opening O3'. From this, we see how the curve C1 (FIG. 14a) is filled in between the points I2 and I3. Similar considerations on the right edge of opening O3 would fill in curve C1 between points I3 and I4. Now if $E_0$ is the nominal dose to clear the photoresist when exposing a completely blank reticle, then an exposure dose ~1.33 $E_0$ the region between points D and D' of curve C1 would be cleared. while at exposure dose ~4 $E_0$ the region between points E and E' of curve C1 would be cleared. Note that these two regions, D–D' and E–E' as printed in photoresist would be centered on each other. The metrology to check source centration is illustrated in FIG. 15a and FIG. 18b. Alignment fiducials AF of FIG. 22c are offset and printed so as to be nominally centered on box B, box B being the image resulting from the effect of apertures O3 and O3'. Object plane feature AF is printed through an opening AF' in the aperture plane large enough that the entire ray bundle arising from each point in the open areas of AF is not in any way obstructed by the borders surrounding AF'. Thus this feature would print at dose $E_0$. The result is FIG. 18b (located in the image plane) with AFP being feature AF nominally centered on B. A cross section of the exposed and developed resist along line F–F' is drawn in FIG. 15a. PR denotes remaining photoresist. Left-right centration of B with respect to projected alignment fiducials AFP is done by first measuring the 2 critical dimensions $CD_L$ and $CD_R$ and taking their difference $\Delta CD = CD_R - CD_L$. This procedure is done twice at exposure levels corresponding to points D–D' (~1.33 $E_0$) and E–E' (~4 $E_0$) with resulting CD differences $\Delta CDa$ and $\Delta CDb$ respectively. The angular misalignment of the source with respect to the exit pupil in the x direction is then given by:

$$\theta x = (\Delta CDa - \Delta CDb)*M^2/z \quad \text{(eq 2)}.$$

The y angular offset is similarly given by:

$$\theta y = (\Delta CDc - \Delta CDd)*M^2/z \quad \text{(eq 3)}.$$

The meaning of the symbols in eq 2 and 3 is provided in the following table:

| | |
|---|---|
| θx | angular misalignment of the source with respect to the exit pupil in the x direction |
| θy | angular misalignment of the source with respect to the exit pupil in the y direction |
| ΔCDa | low dose CD difference in the x direction = $CD_R - CD_L$ |
| ΔCDb | high dose CD difference in the x direction = $CD_R - CD_L$ |
| ΔCDc | low dose CD difference in the y direction = $CD_T - CD_B$ |
| ΔCDd | high dose CD difference in the y direction = $CD_T - CD_B$ |
| M | imaging objective reduction ratio (M:1) |
| z | object plane to aperture plane (O3 to O3') distance |
| $CD_T$ | CD at pattern top (90 degrees) |
| $CD_B$ | CD at pattern bottom (270 degrees) |

The case of a decentered effective source is illustrated in FIGS. 12a–g, FIG. 14b and FIG. 15b. Tilted raybundles in FIGS. 12a–g are shows laterally displaced in succession and the resulting rays that make it past O3' allow us to calculate intensity curve C2 which represents of the image projected to the wafer plane. The low intensity exposure (Line D1–D1' of FIG. 14b) is now shifted with respect to the high intensity exposure (E1–E1' of FIG. 14b). The shift is illustrated through the cross section of F–F' of FIG. 18b in FIG. 15b. CD measurements Cdl and Cdr are not equal at lower dose exposures but become equal at higher doses. In general practice more than 2 doses would be used to get better statistics for the data reduction.

An easy way of constructing these intensity curves is shown in FIG. 13. If C4 represents the intensity at the image plane if only opening O3' is present (O3 for the moment is assumed to be much larger than O3') and C5 represents the intensity at the image plane if only opening O3 is present (O3' for the moment being assumed to be much larger than O3) then the effect decentration is to shift curve C4 transversely. The non-vanishing part of the curve is always that part between points G and G'. In this manner the curves C1 and C2 of FIGS. 14a and 14b are constructed.

Alternative forms of this device are shown in FIGS. 16, 17 and 19. In all cases, the corresponding opening in the aperture plate (O3') is of the same size and shape and aligned to the opening O3 in the object plane.

Because exposure of O3 type alignment marks takes place using close to the nominal clearing dose, it may be desirable to include filters (FI of FIG. 24) located on the backside of reticle R and individually aligned with each opening O3 to decrease the intensity of light. This would be done to minimize blooming or spillover effects onto nearby features printed within the same group.

Source Map

Figure 20A:
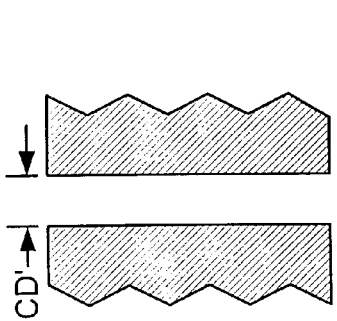
FIGS. 20a–e describe a technique for quantifying the effective source using CD measurements.
Figure 20C:
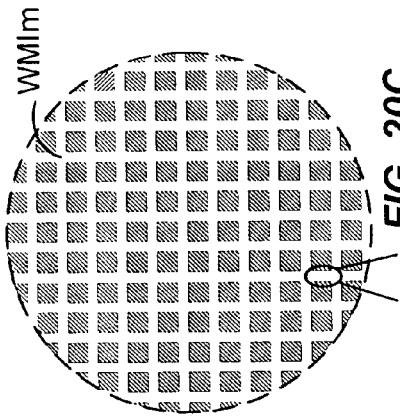
Figure 20B:
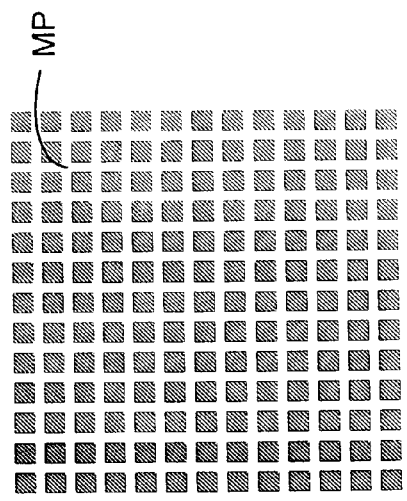
Figure 20D:
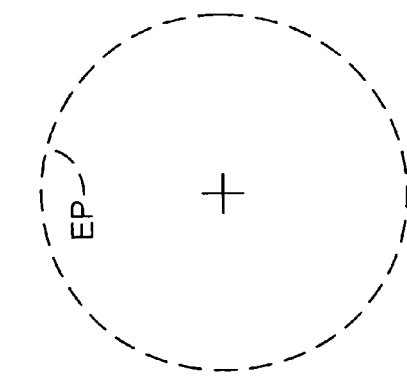
Figure 20E:
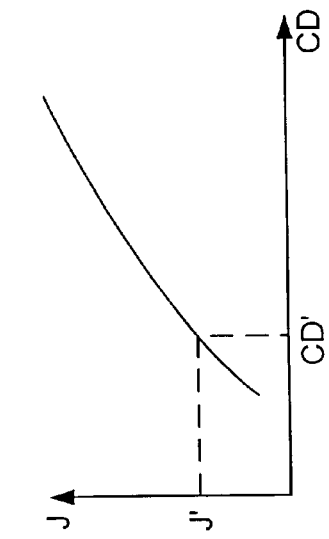

A quantitative technique for determining the luminous intensity of the effective source will now be described. Referring to FIG. 22a, street and alley pattern MP with size larger than R of eq. 1 is made. The number of lines depends on the resolution required but is typically ~5–20 across. Corresponding aperture hole MP' in the aperture plate is underneath (FIG. 23a). FIGS. 20 and 21 illustrate device operation. FIG. 20b shows the interior part of mask or reticle plane pattern MP. FIG. 20a is the projection of the nominal exit pupil onto the mask plane and FIG. 20c shows that part of MP (FIG. 20b) that is within the nominal system exit pupil (WPIm) and would print if the effective source were had constant luminous intensity across the exit pupil. Variations in the luminous intensity will produce variations in the CD of the individual lines printed. FIG. 20d illustrates the CD for a portion of the FIG. 20c. FIG. 20e is a calibration curve from which our measured CD measurements can be correlated with an intensity. The result of making an array of CD measurements and correlating them through a calibration curve is a map of the luminous intensity (energy per unit solid angle) of the effective source.

The procedure for establishing calibration curve of FIG. 20e is briefly:

1) Set illumination to minimum sigma or partial coherence.
2) Pick CD measurement site (from amongst choices of FIG. 20b) located at approximately the maxima of illumination pattern set in 1.
3) Perform a dose array.
4) Measure the CD at site chosen in 2 to get calibration curve.

Note, this is a relative calibration curve. Using it we can get the luminous intensity (energy per unit solid angle) map to within an overall scale factor. Overall scale factor is equivalent to dose which is routinely calibrated anyway.

FIGS. 21a–f illustrate the use of this technique. FIG. 21a outlines the effective source ESI (in this case a disc) and it's relation to entrance pupil EP. The effective source luminous intensity along line A–A' is shown in FIG. 21b. q denotes the source angle. Pattern MP (FIG. 21c) in the object plane sits above opening MP' (FIG. 21f) and when illuminated by the effective source produces the pattern schematically shown by FIG. 21d. Clear areas indicate exposed and developed resist. The CD measurements made along line AA' (FIG. 21d) are made at the intersection of AA' with L1 . . . L11 respectively and give measurements CD1 . . . CD11 respectively. Using the calibration curve of FIG. 20e, we back out relative values J1, . . . J11 of the effective source luminous intensity. These are plotted and the circles in FIG. 21e since the locations of the CD measurements are also known. The resulting dashed curve CI1 is along with the true solid curve CC1.

Other Arrangements

Figure 27:
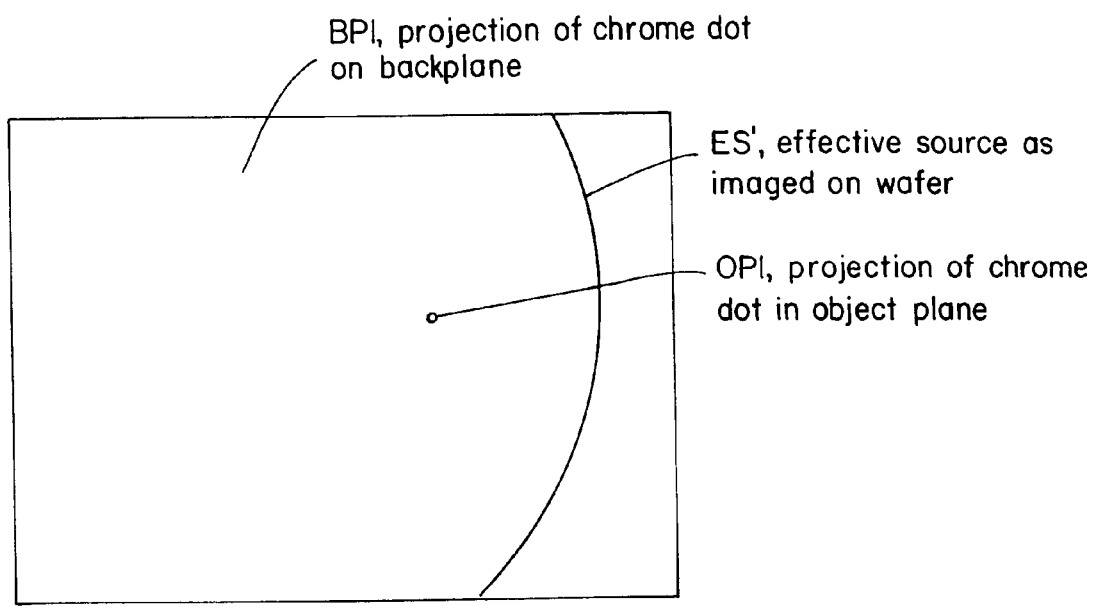
FIG. 27 is a photoresist pattern using openings or obstructions simultaneously in the backplane, object plane and aperture plane

An alternative technique for assessing effective source centration is illustrated in FIG. 27. There, effective source ES' as imaged by a pinhole camera to the wafer plane is shown. It's centration relative to the exit pupil can be judged by it's position relative to mark OP1 or mark BP1. Mark OP1 results from a dot or obscuration present in the object plane OP. The offset of OP1 relative to it's nominal position within ES' is a direct measure of effective source centration. In addition to OP1 is a mark BP1 (FIG. 27) that is due to a feature placed on the backplane BP (FIG. 24) of reticle R. This feature can be used instead of feature OP1 to ascertain effective source centration.

In general, backplane BP can be used for additional structures either in place of or as an adjunct to structures in the aperture plate APL (FIG. 24). In particular, all of the previously described aperture plate structures (with slight modification) could be placed on backplane BP and the result would perform substantially the same. All 3 planes BP, OP and AP can be used together as in FIG. 27 for effective source diagnosis.

The following describes a direct technique for determining σ, the partial coherence. Once the condenser has been adjusted so the effective source is centered on the exit pupil, an exposure through a series of object plane obstructions of different diameters is made. A set of object plane openings having centered circular obstructions of successively increasing diameters and each has a corresponding aperture plate opening. The effect of the circular obscuration is to cover a corresponding central portion of the effective source image leaving only a circular ring. The circular ring width and the known diameter of the circular obscuration allow the source diameter to be ascertained from a single CD measurement. By using an array of different diameter obscurations, multiple measurements of σ can be made. This arrangement can be implemented as a cluster of nearby pinholes (each with a different diameter object plane obstruction), the pinholes being near enough together that any variation in the effective source can be ignored. Alternatively, separate reticle/aperture plane units, each unit having a different object plane obstruction diameter could be used.

Another technique for visually quantifying source size, shape and position is shown in FIGS. 25 and 26. Calibration pattern GR1 (FIG. 25a) resides in the object plane and is offset from patterns used for field point specific diagnosis. Thus in FIG. 22b, calibration pattern GR1 is located so it can be bladed off (not exposed) while field point specific patterns G1 . . . G100 are exposed. Calibration pattern GR1 is then stepped over to a pinhole camera exposure and itself exposed, the result being a pinhole camera image surrounded by a reference pattern of known size, orientation, and placement. In more detail, the following steps are carried out:

1) Expose one or more field specific patterns G1–G100. For illustration subpattern PC1 (FIG. 22a) and corresponding opening PC1' (FIG. 23a) are considered. This technique applies to any of the other patterns. The resulting pattern in exposed photoresist for an unobscured aperture stop and annular source is AN10 of FIG. 25b. Shaded regions indicate exposed photoresist.

2) Step the exposed wafer so AN10 is nominally centered underneath the projected image of calibration pattern GR1 of FIG. 25a. FIG. 25a is the object plane pattern. Shaded regions are chrome.

3) Aperture down on calibration pattern GR1 and expose. The resulting exposure pattern is shown in FIG. 25c. Shaded areas indicate exposed photoresist. Having the transverse scale of GR1 in integer units of $\tan(\theta)/\tan(\theta_{NA})$ allows for direct read off of angular size and centering. In the above:

θ=angle of the effective source relative to chief ray $\theta_{na}$=arcsin(NA), NA=numerical aperture of imaging objective.

A calibration pattern set useful for σ measurement consists of a set of opaque rings of varying diameter. Choosing a ring slightly larger than the stepper σ setting and printing it over the projected pinhole image, would provide a quick and accurate check on σ as a function of field position.

Other calibration patterns such as that shown in FIG. 26 could also be used. Since different effective source configurations (conventional, annular, quadrupole, etc.) and different measurements (centration, diameter, x/y width, asymmetry) are best done with different calibration patterns, numerous patterns (other than GR1) could be arrayed in object plane OP (FIG. 22b) and used under the most favorable circumstances. Alternatively, instead of stepping around calibration pattern GR1, a separate reticle consisting of an array of calibration patterns (of which GR1 or GR2 are examples), one for each group G1 . . . G100, could be loaded in and printed. The resulting exposed wafer and information gleaned would be practically identical.

Since an exposure at only a single z plane is necessary for the operation of this invention, variations of this technique can utilize electrical methods such as the van der Pauw resistors (Hasan et al., *IEEE Transactions on Electron Devices* ED-27, #12 (1980) and Zych et al., *Optical Lithography V*, SPIE 633:98 (1986)) to ascertain source centration. Another electrical technique would utilize resistance measurements to obtain the CD map and thereby infer the effective source luminous intensity.

For purposes of illustration the diagrams, descriptions, and equations have be restricted to an image and object side telecentric system. This device and it's technique of use can be easily modified by those skilled in the art to include imaging systems nontelecentric on object, image or on both object and image sides.

Also, the photoresist systems used to illustrate this invention have been of the positive type. Negative type photoresists could equally well be used.

This device has been described with respect to imaging systems utilizing transmissive object plane masks. It could be readily adapted for use is systems using reflective object plane masks such as the short wavelength (λ~10–20 nm) X ray systems proposed in Cegilo et al.,*J. Vac. Sci. Technology B*, #6, 8:1325 (1990) and Viswanathan and Newman, *OSA Proceedings on Soft-X-Ray Projection Lithography*, 12:30 (1991). In such a system, the aperture plate could be placed in a pellicle plane if additional openings were provided to allow for unobstructed illumination by the effective source of the region of interest in the object plane. Then, providing the distance from the object plane mask surface were large enough, an appropriately placed aperture hole could be used. The roles could be reversed, light being first incident on an aperture hole, then mask, then large unobstructed opening in the aperture plate. Other arrangements where the aperture plate and/or backplane apertures are placed at locations where this dual use is not required is also possible. For instance, placing the aperture plate at a location where it does not obstruct light illuminating the object plane mask would produce a workable SMI.

What has been said above for reflective mask systems also applies to transmissive mask systems. The aperture plane or backplane need not be located at within the pellicle envelope or physically attached to the object plane mask. They can be separately inserted at appropriate locations in the imaging objective or condenser beamtrain if the manufacturer has made provision for such a plate.

The use of this device has been described in reference to its use in projection photoexposure systems such as those described in Sato et al., U.S. Pat. No. 4,861,148; T. Whitney, U.S. Pat. No. 5,386,319; [No Ref. 41??], Yoshitake et al., *Optical/Laser Microlithography IV*, SPIE 1463:678 (1991); Yudong et al., *Optical/Laser Microlithography IV*, SPIE 1463:688 (1991); van den Brink et al., *Optical/Laser Microlithography IV*, SPIE 1463:709 (1991);

Unger and DiSessa, *Optical/Laser Microlithography IV*, SPIE 1463:725 (1991); Arnold and Escher, *Proceedings of BACUS conference, SPIE Critical Reviews of Optical Science and Technology*, CR51:42 (1993); Feldman and King, U.S. Pat. No. 3,819,265; E. Glatzel, 1980 *International Lens Design Conference (OSA)*, SPIE 237:310 (1980) and Phillips and Buzawa, 1980 *International Lens Design Conference (OSA)*, SPIE 237:3 29 (1980). Such photoexposure systems can take the form of refractive or catadioptric, fixed field step and repeat systems, slit type scanning systems, or scanning step and repeat systems. However it can equally well be used for other instruments such as projection ablation tools, scanning imaging or ablation systems, 9,13, for cameras, microscopes and most conveniently in any instrument having a readily useable recording plane. Additionally, using backplane architecture (there will generally be no room for an aperture plate between object and image plane) contact printer and proximity printer system (Kouno et al., *J Vac. Sci. Technology B*, #6, 6:2135 (1988)) can also have their effective sources diagnosed.

Additional Material in this Continuation-in-Part

Referring to FIGS. 22*a* and 22*b*, the provided source metrology instrument (SMI) need only contain pinhole cameras comprising features PC1 of FIG. 22*a* and PC1' of FIG. 23*a* and calibration or reference frame pattern GR1 of FIGS. 22*b*, 22*d*, 25*a*. These features, pinhole cameras and reference frames, may reside on a single physical package as shown in FIGS. 22*b*, 23*b*, and 24 or they may reside on separate physical packages, for example a separate reticle may be used for the reference arrays (vide supra).

Figure 28:
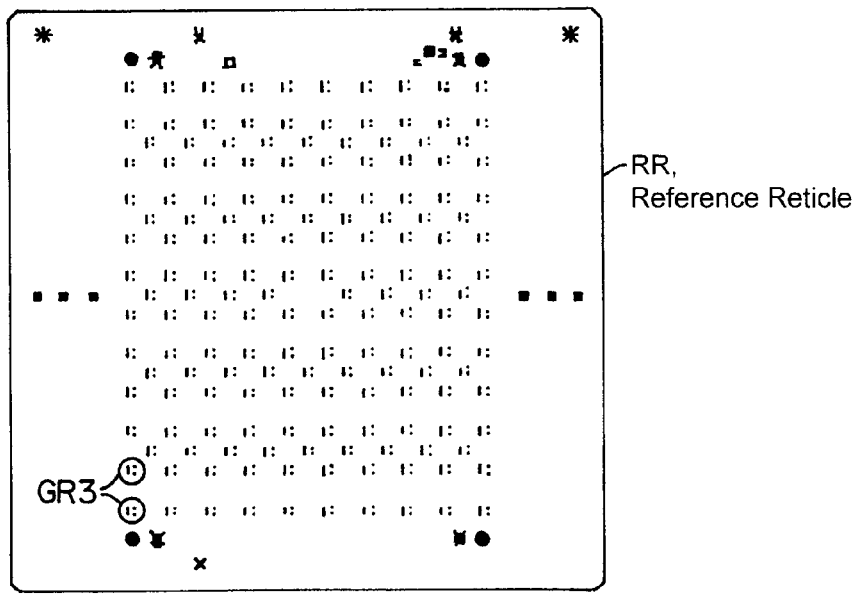
FIG. 28 shows a reference reticle that is used in conjunction with a pinhole camera for creating machine-readable images
Figure 29:
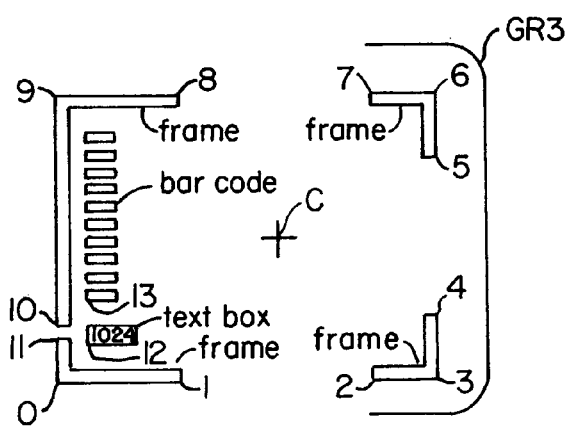
FIG. 29 shows one design for the reference arrays on the reference reticle

FIG. 28 shows an example reference reticle, RR, containing calibration patterns or reference frames GR3. Reference reticle RR contains a multiplicity of reference arrays, GR3, one for each pinhole camera on the SMI. These reference frames are shown in detail in FIG. 29. There, exemplary dimensions in microns are given for the reference frame and the center mark, C, where the nominal pinhole center is located, is indicated. The size of reference frame GR3 is chosen so that it fits within the field of view of standard microscope objectives (typically of 10 x power) and does not obscure the image from the pinhole camera. Additionally, when using the reference reticle RR, each pinhole camera will have a different reference frame, GR3, each of these reference frames can have a unique number designating the pinhole camera or field point number being measured. FIG. 29 shows an individual reference frame with the field point number indicated in text (text box) and as a machine-readable binary bar code (bar code).

Expose Pinhole Cameras

Figure 30:
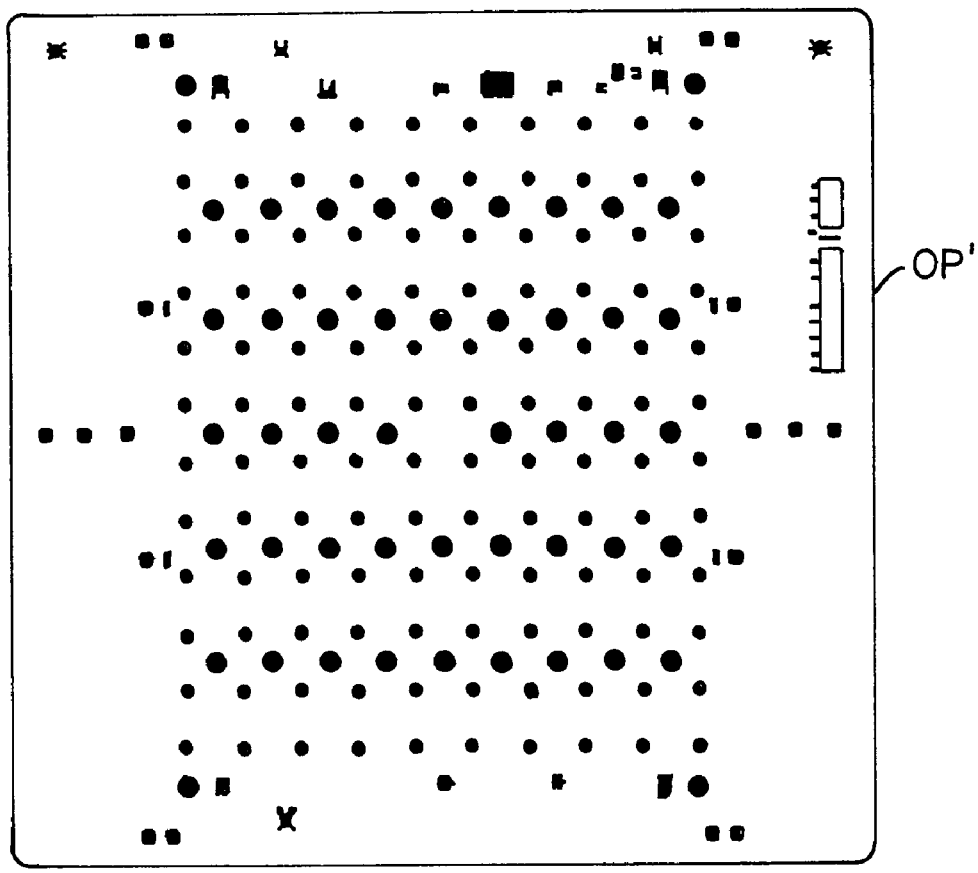
FIG. 30 shows the object plane of an SMI to be used in conjunction with the reference reticle of FIG. 29
Figure 31:
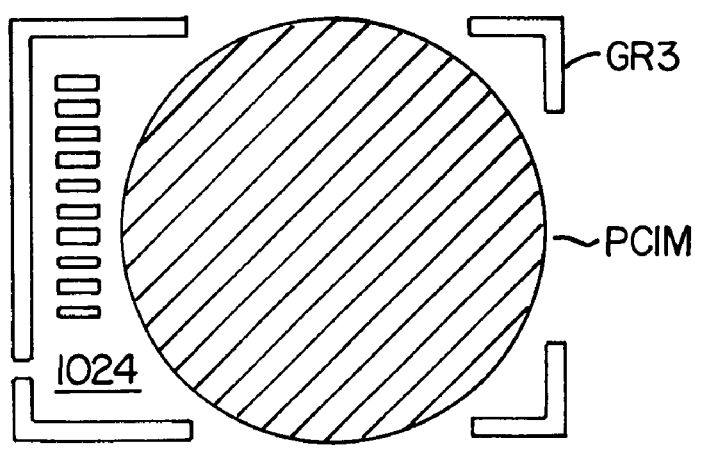
FIG. 31 shows another example of a pinhole camera image surrounded by a calibration or reference frame

As delineated in the above citation, the pinhole cameras are exposed and the calibration pattern or reference array is printed over it. For the reference reticle RR of FIG. 28, the corresponding object plane (OP') on the SMI is shown in FIG. 30. An example at a single field point of this exposure using the reference array of FIG. 25*a* and the source of FIG. 25*b* is shown in FIG. 25*c*. FIG. 31 shows a pinhole camera image, PCIM, surrounded by frame GR3.

Figure 32:
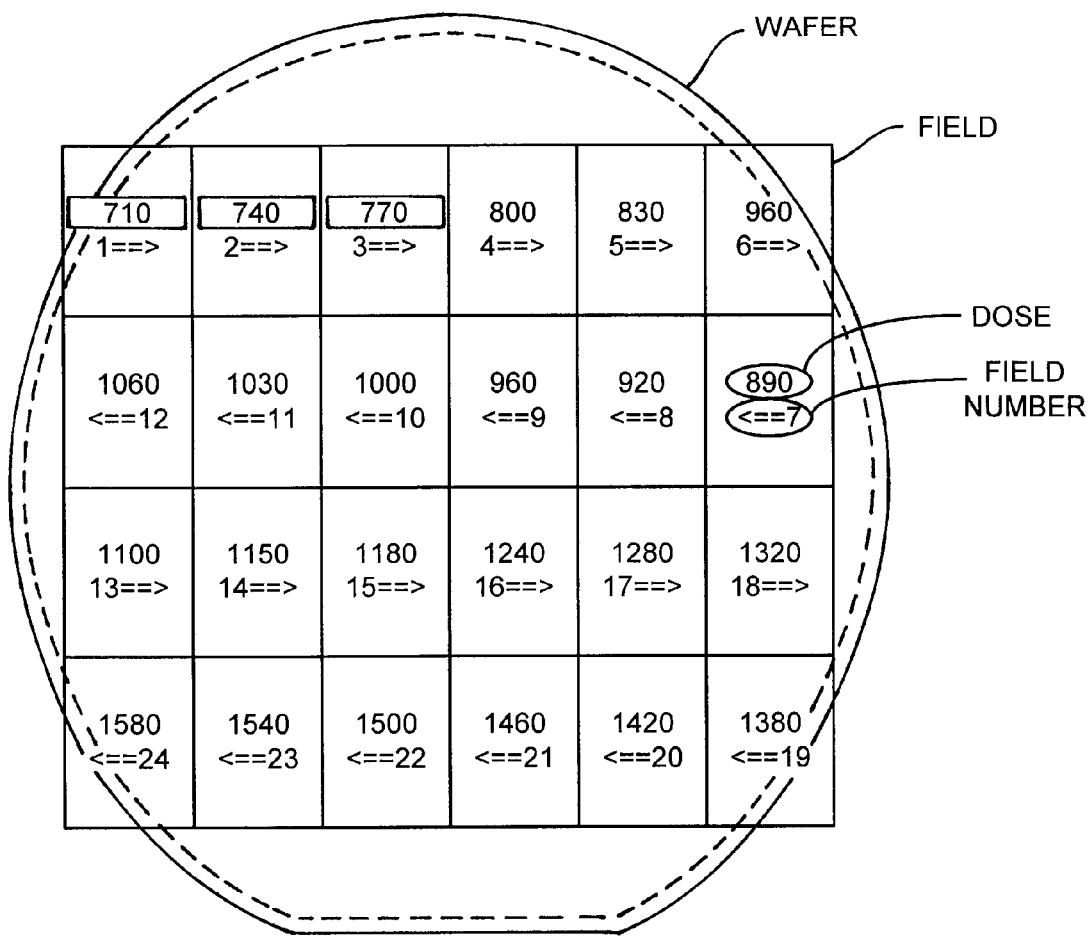
FIG. 32 shows the wafer layout of fields for the dose meander required by the first new embodiment

At this point, we deviate from the discussion of McArthur et. al. (Ser. No. # 09/247,446). Rather than make a single exposure of the effective source through the pinhole cameras, we expose a dose array on the wafer; each dose corresponding to a separate field. FIG. 32 illustrates a wafer exposed in a dose array starting at 710 mJ/cm^2 through 1580 mJ/cm^2 spanning 24 fields on the wafer. This particular dose array is for illustration only; the minimum dose is typically set at:

$$Emin = E0*(Wsource/Wpinhole)/10 \qquad (eq\ 4)$$

and the maximum dose is typically set at:

$$Emax = E0*(Wsource/Wpinhole)*5 \qquad (eq\ 5)$$

where:

E0=E-zero or dose where an open frame photoresist exposure just clears

Wsource=the solid angle of the source on the image side. Thus for a conventional source with partial coherence s, and imaging objective numerical aperture NA, this would be:

Equal to pi*(s*NA)^2

Wpinhole=the solid angle of the pinhole as seen from the image side=Area_pinhole*M^2/z^2 where M is the projection imaging system reduction magnification ratio we are measuring the Effective source on; and, z is the effective distance of the pinhole from the object plane (reticle plane).

These dose ranges allow for a 50:1 dynamic range in the measurement of the effective source.

The reference frame is always exposed at the nominal dose which is approximately 2–4*E0.

Figure 33:
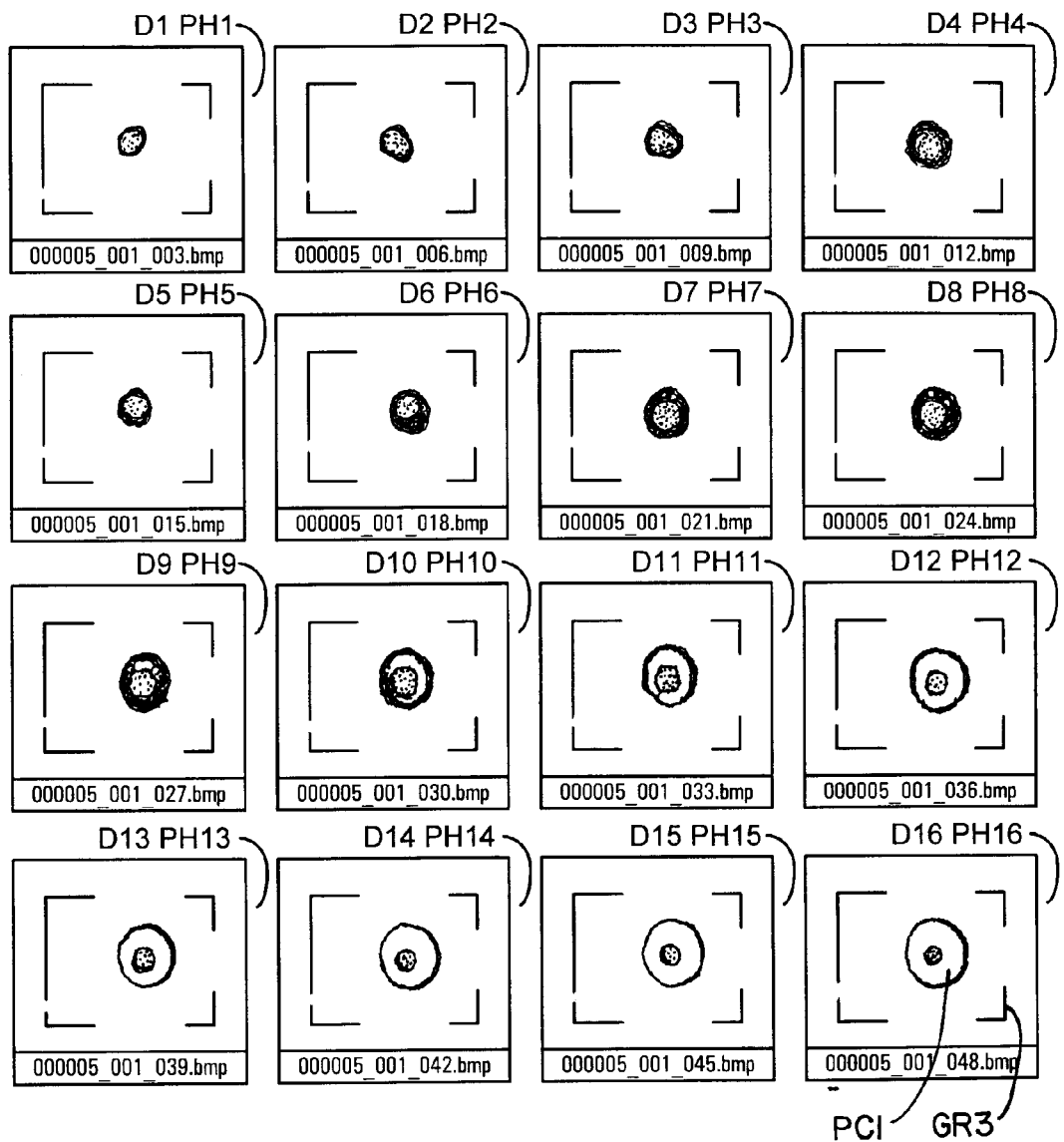
FIG. 33 shows an array of pinhole camera images taken at different doses surrounded by reference frames taken at a single dose, all for a single field point

FIG. 33 shows the pinhole camera image, PCI, and reference frame image, GR3, for a single field point (field point 1) at an array of increasing doses, D1, D2 . . . D16.

Take Machine Readable Photos

At each dose, and for each field point, a microscope attached to a CCD camera takes a machine-readable photo. Machine-readable means the photo is stored in a format suitable for image processing software. Examples of such formats are bitmap (.BMP), JPEG, or TIFF. FIG. 33 shows photos what were stored in the .BMP format. The CCD camera that takes these photos preferably saves color images. Using color images improves the results of the subsequent processing of these images.

Reconstruct Radiant or Luminous Intensity Profile

For each field point, the sequence of photos taken at different doses is analyzed. Because the reference frame has a known size and is also nominally positioned under each pinhole camera, both the absolute scale and position of the pinhole camera image, PCI, in each photo is known. At each dose, the PCI region that is exposed is determined using image processing algorithms. The region of the i'th picture so determined corresponds to a value of the radiant intensity that is at a value greater than a number Ji which is proportional to 1/Di where Di is the dose on the pinhole camera. Put differently, the developed out region of the pinhole camera image PCI that is on the I'th image corresponds to values of the radiant intensity, dE/do roughly satisfying:

$$dE/do >= a/Di \qquad (eq\ 6).$$

Here, the constant, a, is the same for all images in the image sequence.

By roughly satisfying, there are some radiometric corrections involving factors of 1/cos(q) where q is the angle of the incident illumination relative to the entrance or exit pupil that are included in the actual mathematical reconstruction process. These factors are known; the mapping describing the relation between wafer position within a field point and direction cosine being as expressed in McArthur et. al. (Ser. No. # 09/247,446).

Looking at FIG. 33, we see that the lowest dose at which the PCI has developed all the way through is D8. Thus the developed out region at exposure D8 will correspond to the highest value of the radiant intensity of the effective source. Since this region did not develop out at dose D7, we can say (to within the radiometric factors that are ~1) the radiant intensity within this region of the effective source is in the range dE/do=a/D8 a/D7. If the dose increment between D7 and D8 is small enough, we can reasonably approximate the radiant intensity in the developed out region of image ph7 as the average of these two.

Going to the next photo, ph9, at the next dose, D9, the image processing software determines the developed region of the PCI. The region developed out in the previous image, ph8, is then removed and the resulting region then consists of regions of the effective source that are in the range dE/do=a/D9: a/D8. Again, if the increment between D8 and D9 is small enough, we can average the result and call it the radiant intensity of the resulting region.

Figure 34:
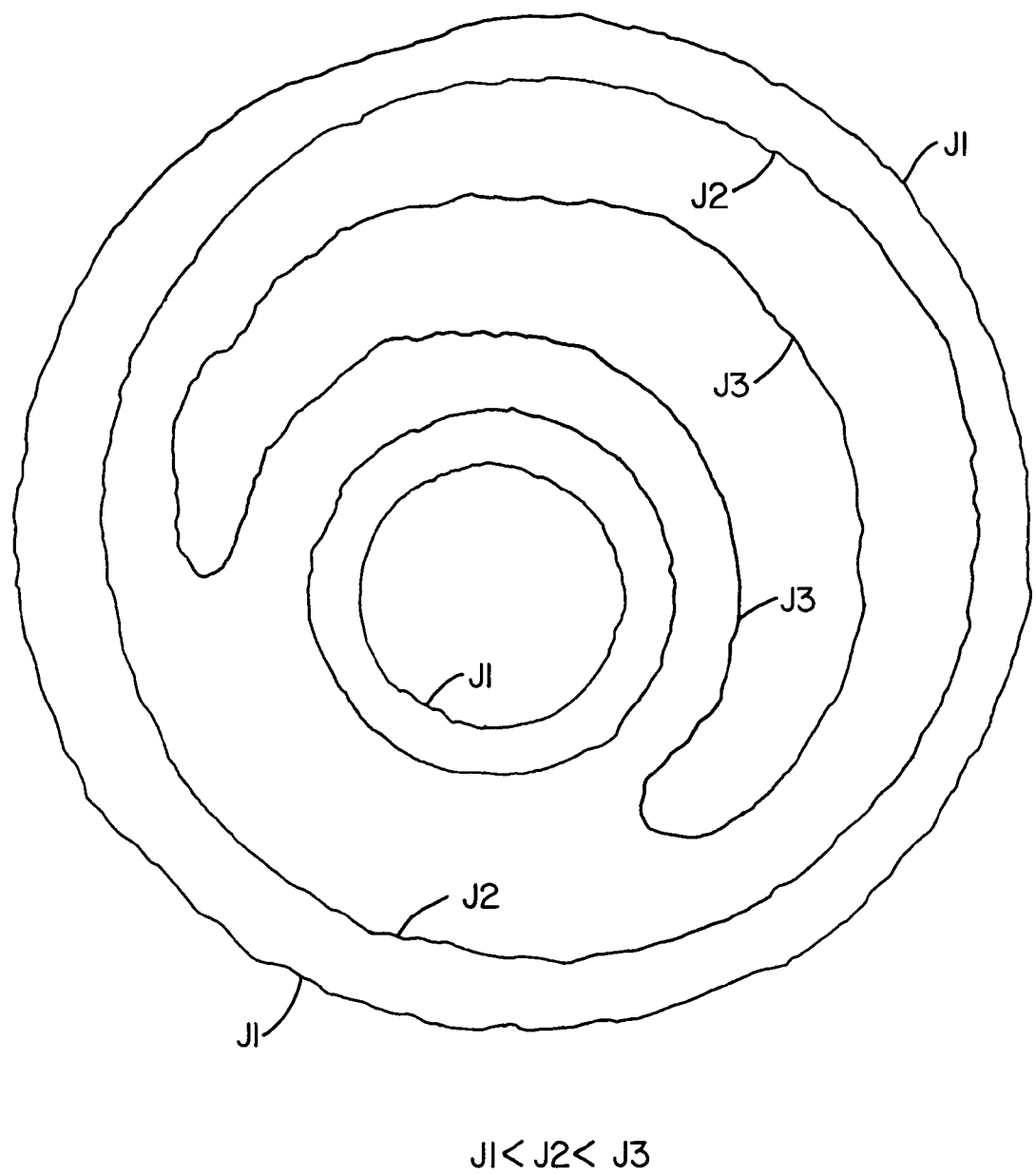
FIG. 34 shows a contour plot of a radiant intensity profile obtained using the method of this invention
Figure 35:
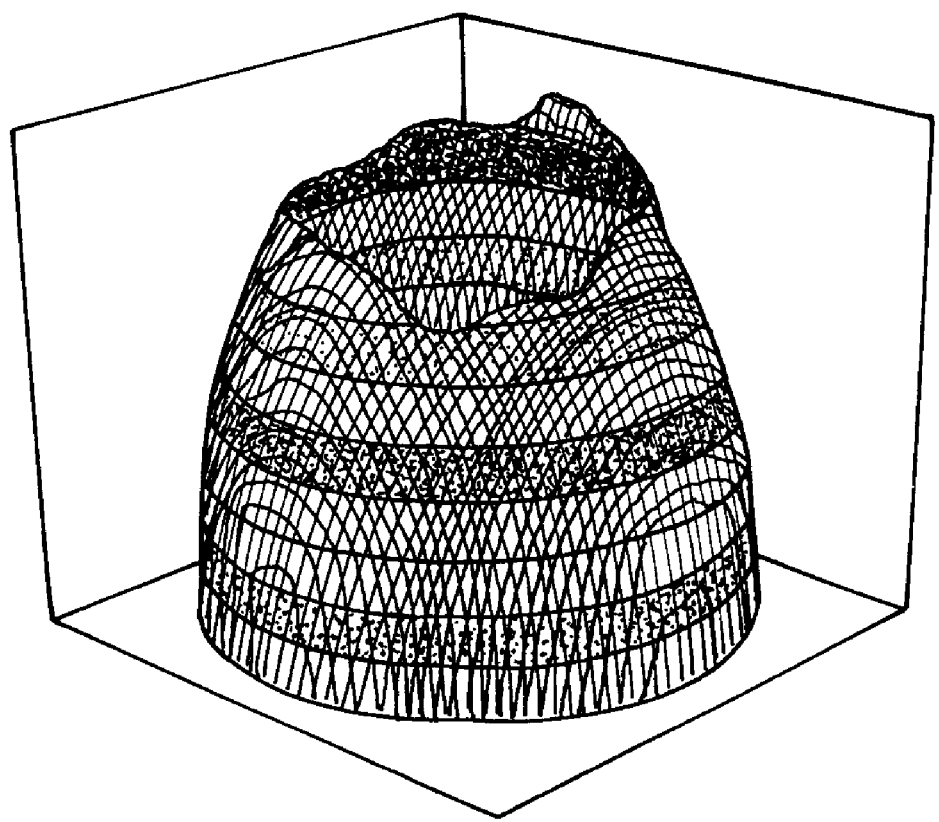
FIG. 35 shows a 3-dimensional plot of a radiant intensity profile obtained using the method of this invention

This process then continues image by image until we have built up a map of the entire radiant intensity profile. FIG. 34 shows a contour plot, and FIG. 35 a 3-dimensional plot of the radiant intensity profile so obtained. The constant 'a' is not determined but the entire radiant intensity profile is determined to within an overall normalization constant.

Referring to FIGS. 22a and 22b, the provided source metrology instrument (SMI) need only contain pinhole cameras comprising features PC1 of FIG. 22a and PC1' of FIG. 23a.

Details of Other Embodiments

Figure 36:
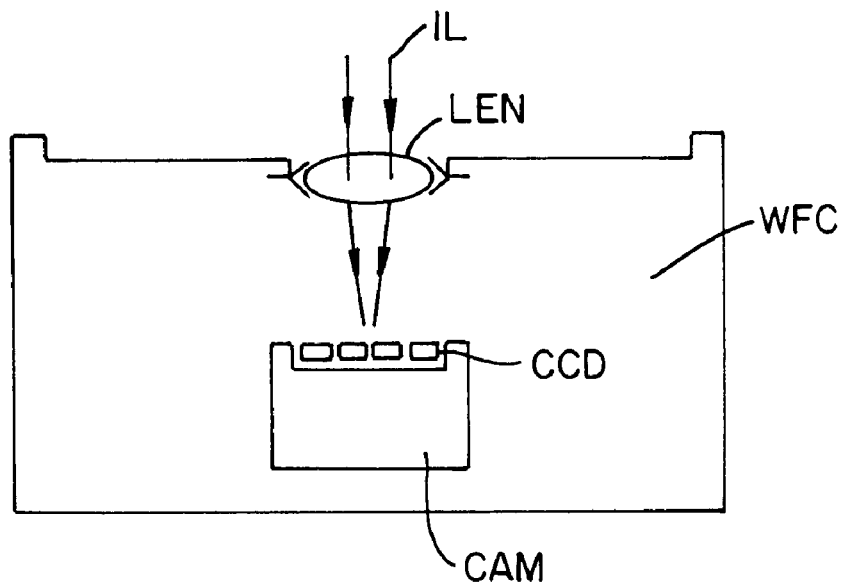
FIG. 36 shows a CCD camera embedded in a wafer chuck that is used as the recording media in the method of this invention

At this point, we deviate from the discussion of McArthur et. al. (Ser. No. # 09/247,446). The recording media will now be an electronic sensor an example of which is a CCD camera with an imaging lens that is embedded in the wafer chuck of the tool under consideration. FIG. 36 shows a CCD camera or other electronic image recording element (CCD) that is attached to camera CAM and embedded in wafer chuck WFC that is part of the tool that is being diagnosed (not shown). The action of this device in conjunction with the SMI is as follows.

Incident light IL that forms pinhole camera image PCI is first incident on lens group LEN that collectively alters the size of pinhole camera image PCI so it fits the format of the CCD array CCD. By fitting the CCD camera format we mean that pinhole camera image PCI is magnified or de-magnified so it does not overfill the CCD array but is still large enough that we do not suffer significant resolution loss due to the image pixelization. Ideally, the image size will be somewhere between 50% and 90% of the CCD array size.

Next, the pinhole camera image PCI being captured by the CCD array is converted to a video signal by camera CAM (or saved as a digital image by camera CAM) and then saved by an image grabber board as a digital image. In this digital image, the intensity of each pixel will be directly proportional to the radiant intensity profile.

Figure 37:
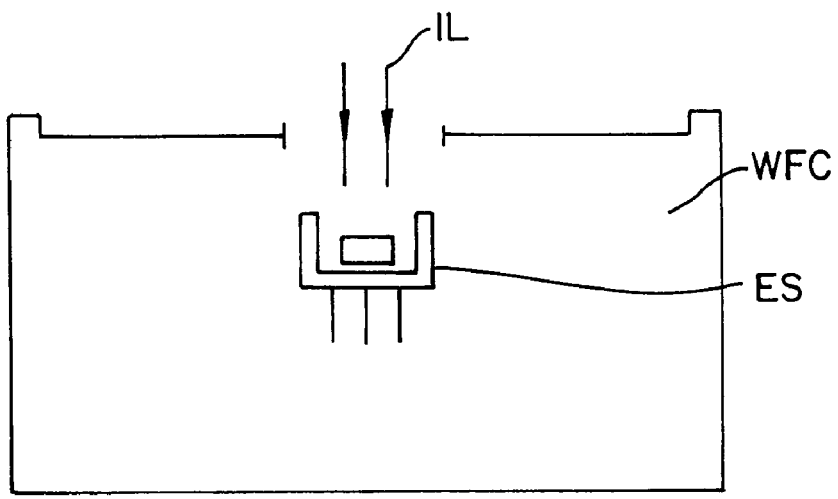
FIG. 37 shows an electronic sensor, ES, of the single element or line element type that when used in conjunction with motion of the wafer chuck WFC is used as the recording media in the method of this invention

Another embodiment of this invention is illustrated by FIG. 37 which shows a electronic sensor, ES, of the single element or line element type that when used in conjunction with motion of wafer chuck WFC is used as the recording media in the method of this invention. In the simplest version, electronic sensor ES is a single photodiode that is moved from point to point under the pinhole camera image PCI and the signal is read out as it moves from point to point. The resulting intensity when saved and displayed as a function of position gives us a map of the radiant intensity profile.

If electronic sensor ES can be a line type detector (i.e. it consists of a number of electronically sensitive elements arrayed in a linear or 1-dimensional array). Then instead of requiring a 2 dimensional point to point movement to capture the entire PCI image, only a 1-dimensional motion of wafer chuck WFC that is perpendicular to the 1-dimensional array extent is required. Then the resulting signal when plotted as function of WFC position and 1-dimensional array position gives us directly a map of the radiant intensity.

Figure 38:
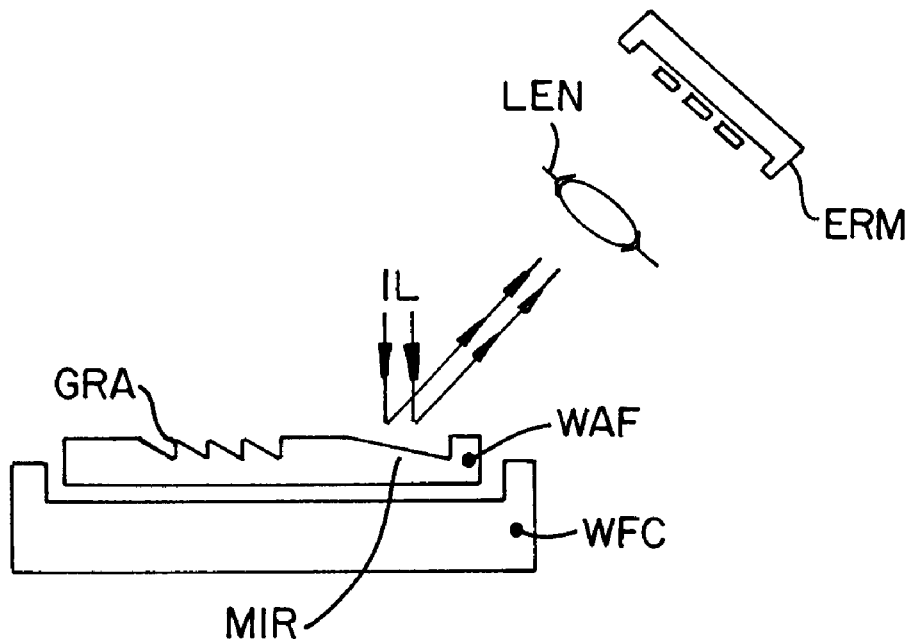
FIG. 38 shows a wafer with gratings or mirrors disposed thereon that reflect the incident light from the pinhole camera image onto an electronic detector that sits off of the wafer chuck

Yet another embodiment of this invention if shown in FIG. 38 where a wafer W with gratings GRA or mirror MIR disposed thereon reflect the incident light IL of the pinhole camera image onto an electronic detector or electronic recording means ERM that sits off of the wafer chuck. Not placing the electronics on the wafer chuck allows for simpler engineering of the lens LEN and electronic recording media ERM.

Figure 39:
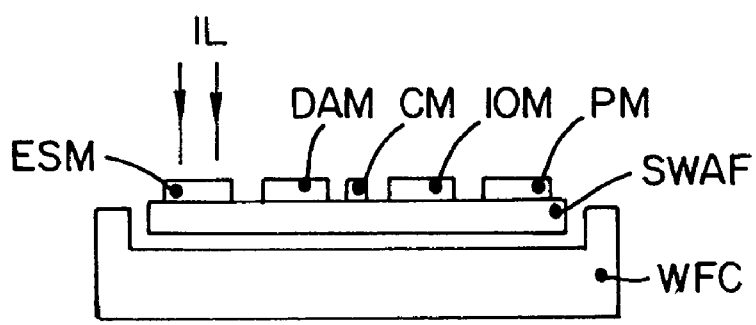
FIG. 39 shows a smart wafer that is a self-contained sensor and data accumulator that can be read out either directly or remotely.

Yet another embodiment of this invention is shown in FIG. 39. There, smart wafer SWAF is a self-contained sensor and data accumulator that can be read out either directly or remotely. Incident light IL for pinhole camera image PCI is incident on electronic sensing means ESM. ESM can be a single element photodetector, 1-dimensional array, or 2-dimensional CCD array. Which sensor is used will determine the motion profile required of wafer chuck WFC to accumulate the image.

After being sensed by ESM, the data is then sent to data accumulation means DAM which stores the data until it can be ultimately read out. DAM is typically computer memory such as DRAM or SRAM but is any form that can be conveniently packaged in a wafer thick format.

After all the necessary data has been accumulated, the wafer is read out through input-output means IOM. IOM can consist pads for a probe card or possibly a high frequency radio link that does not require physical contact for communication. IOM is also used for accepting instructions that are executed by command module CM.

Additionally, power means PM is also disposed on smart wafer SWAF. SWAF is designed as an ordinary wafer so it can be readily passed in and out of the scanner under consideration. Therefore, the electronics required is either resident on SWAF and manufactured as a wafer scale integrated package or the components are bonded to the top surface of SWAF and interconnected through a thin interconnection layer. The SWAF is typically thinned on the backside so that the entire package thickness fits within a standard wafer thickness envelope.

An additional remark on the overall use of this invention. We have heretofore assumed that the lens or projection imaging system optics has a uniform transmission as a function of pupil angle. This condition is typically meant with in practice.

However, it may be desirable in cases where the transmission is a stronger function of angle or where greater accuracy required to note that the quantity measured by the SMI is actually the product of the lens transmission, T(nx, ny), and the radiant intensity, dE(nx,ny)/do. Therefore, if we know by other means the transmission, we can correct for the effect of the transmission on the measured value of the radiant intensity by merely dividing it out.

Thus;

$$dE(nx,ny)/do \rightarrow dE(nx,ny)/do/T(nx,ny) \qquad (eq\ 7).$$

What is claimed is:

1. A process of measuring the radiant intensity profile of an effective source of an projection image system having an effective source, an object plane, an imaging objective, an exit pupil, and an image plane, the process comprising the steps of:

provide an array of field points on an object plane of the projection imaging system;

providing a corresponding array of aperture plane apertures displaced from the object plane a sufficient distance to image the effective source, the array of corresponding object plane apertures corresponding to the field points on the object plane;

selecting at least one field point and a corresponding aperture plane aperture;

projecting a plurality of images of the selected field point through the corresponding selected aperture plane aperture at a plurality of various intensities of the effective source to produce at the image plane a corresponding plurality of images of the effective source image at the selected field point;

recording the plurality of effective source images of the selected field points on recording media at the image plane to produce recorded images for each of the plurality of various intensities; and, analyzing the recorded images of the effective source on the media for the selected field point and aperture plane aperture to determine a radiant intensity profile of the image source at the selected field point.

2. The process of measuring the radiant intensity profile of an effective source of an projection image system according to claim 1 and comprising the further steps of:

selecting a plurality of field points and a corresponding aperture plane apertures; and, for each selected field point repeating the projecting, recording and analyzing steps.

3. The process of measuring the radiant intensity profile of an effective source of an projection image system according to claim 1 and comprising the further steps of:

the projecting a plurality of images step includes projecting frame patterns.

4. The process of measuring the radiant intensity profile of an effective source of an projection image system according to claim 1 and comprising the further steps of:

the projecting a plurality of images step includes projecting a unique number designating the field point.

5. The process of measuring the radiant intensity profile of an effective source of an projection image system according to claim 1 and comprising the further steps of:

the projecting a plurality of images of the selected field point through the corresponding selected aperture plane aperture at a plurality of various intensities of the effective source includes using a minimum intensity equal to:

$$Emin=E0*(Wsource/Wpinhole)/10$$

and using a maximum intensity equal to:

$$Emax=E0*(Wsource/Wpinhole)*5$$

where:
E0=E-zero or dose where an open frame photoresist exposure just clears
Wsource =the solid angle of the source on the image side; and,
Wpinhole =the solid angle of the pinhole as seen from the image side.

6. The process of measuring the radiant intensity profile of an effective source of an projection image system according to claim 1 wherein the analyzing the recorded images of the effective source on the media for the selected field point includes:

taking machine readable images.

7. The process of measuring the radiant intensity profile of an effective source of an projection image system according to claim 1 wherein the analyzing the recorded images of the effective source on the media for the selected field point includes:

producing a contour plot of the radiant intensity profile.

8. The process of measuring the radiant intensity profile of an effective source of an projection image system according to claim 1 wherein the analyzing the recorded images of the effective source on the media for the selected field point includes:

producing a three dimensional plot of the radiant intensity profile.

9. The process of measuring the radiant intensity profile of an effective source of an projection image system according to claim 1 wherein the recording of the recorded images of the effective source on the media for the selected field point includes:

recording the machine readable images on a charge coupled device (CCD).

10. The process of measuring the radiant intensity profile of an effective source of an projection image system according to claim 1 wherein the recording of the recorded images of the effective source on the media for the selected field point includes:

recording the images utilizes a line type detector; and, moving the line type detector in one dimension across the image plane.

11. The process of measuring the radiant intensity profile of an effective source of an projection image system according to claim 1 wherein the recording of the recorded images of the effective source on the media for the selected field point includes:

reflecting the images from the image plane to an image recorder.

12. The process of measuring the radiant intensity profile of an effective source of an projection image system according to claim 1 wherein the recording of the recorded images of the effective source on the media for the selected field point includes:

providing a wafer chuck having an image recorder; and, recording the image at the image recorder.

13. Apparatus for measuring the radiant intensity profile of an effective source of an projection image system having an effective source, an object plane, an imaging objective, an exit pupil, and an image plane, the apparatus comprising:

an array of field points on an object plane of the projection imaging system;

a corresponding array of aperture plane apertures displaced from the object plane a sufficient distance to image the effective source, the array of corresponding object plane apertures corresponding to the field points on the object plane;

means for selecting at least one field point and a corresponding aperture plane aperture;

means for projecting a plurality of images of the selected field point through the corresponding selected aperture plane aperture at a plurality of various intensities of the effective source to produce at the image plane a corresponding plurality of images of the effective source image at the selected field point;

means for recording the plurality of effective source images of the selected field points on recording media at the image plane to produce recorded images for each of the plurality of various intensities; and, means for analyzing the recorded images of the effective source on the media for the selected field point and aperture plane aperture to determine a radiant intensity profile of the image source at the selected field point.

14. Apparatus for measuring the radiant intensity profile of an effective source of an projection image system according to claim 13 and wherein:

the means for recording the plurality of effective source images of the selected field points on recording media at the image plane includes a reflecting media at the image plane and a detector removed from the image plane.

15. Apparatus for measuring the radiant intensity profile of an effective source of an projection image system according to claim 13 and wherein:

the means for recording the plurality of effective source images of the selected field points on recording media at the image plane includes a charged couple device and lenses for sizing the image with respect to the charge coupled device.

* * * * *